(12) United States Patent
Hosoda et al.

(10) Patent No.: US 11,174,411 B2
(45) Date of Patent: Nov. 16, 2021

(54) LIQUID COMPOSITION, AND METHOD FOR PRODUCING A FILM AND A LAMINATE BY USING THE LIQUID COMPOSITION

(71) Applicant: AGC Inc., Chiyoda-ku (JP)

(72) Inventors: Tomoya Hosoda, Chiyoda-ku (JP); Tatsuya Terada, Chiyoda-ku (JP); Shigeki Kobayashi, Chiyoda-ku (JP); Atsumi Yamabe, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 52 days.

(21) Appl. No.: 16/249,020

(22) Filed: Jan. 16, 2019

(65) Prior Publication Data

US 2019/0144700 A1    May 16, 2019

Related U.S. Application Data

(63) Continuation of application No. PCT/JP2017/026552, filed on Jul. 21, 2017.

(30) Foreign Application Priority Data

| Jul. 22, 2016 | (JP) | JP2016-144722 |
| Feb. 15, 2017 | (JP) | JP2017-026385 |
| May 18, 2017 | (JP) | JP2017-099294 |

(51) Int. Cl.

| C08J 3/12 | (2006.01) |
| C09D 127/18 | (2006.01) |
| C08F 18/08 | (2006.01) |
| C08F 20/04 | (2006.01) |
| C08F 16/24 | (2006.01) |
| C08F 22/06 | (2006.01) |
| C08L 27/18 | (2006.01) |
| B32B 15/082 | (2006.01) |
| C08J 5/18 | (2006.01) |
| C08F 14/26 | (2006.01) |
| C08L 101/00 | (2006.01) |
| C08F 20/18 | (2006.01) |
| C08F 234/00 | (2006.01) |
| C08F 20/32 | (2006.01) |
| C08F 214/26 | (2006.01) |
| B32B 15/08 | (2006.01) |
| H05K 1/03 | (2006.01) |
| H05K 3/28 | (2006.01) |
| C09D 5/00 | (2006.01) |
| H05K 3/06 | (2006.01) |

(52) U.S. Cl.
CPC ............ *C09D 127/18* (2013.01); *B32B 15/08* (2013.01); *B32B 15/082* (2013.01); *C08F 14/26* (2013.01); *C08F 16/24* (2013.01); *C08F 18/08* (2013.01); *C08F 20/04* (2013.01); *C08F 20/18* (2013.01); *C08F 20/32* (2013.01); *C08F 22/06* (2013.01); *C08F 214/262* (2013.01); *C08F 214/265* (2013.01); *C08F 234/00* (2013.01); *C08J 5/18* (2013.01); *C08L 27/18* (2013.01); *C08L 101/00* (2013.01); *C09D 5/002* (2013.01); *H05K 1/03* (2013.01); *H05K 1/0373* (2013.01); *H05K 3/06* (2013.01); *H05K 3/28* (2013.01); *H05K 3/285* (2013.01); *C08F 2800/10* (2013.01); *H05K 2201/015* (2013.01); *H05K 2203/0759* (2013.01)

(58) Field of Classification Search
CPC .................. C09D 127/18; C09D 4/00; H05K 2201/015; C08J 2327/16; Y10T 428/3154
See application file for complete search history.

(56) References Cited

U.S. PATENT DOCUMENTS

| 2007/0015857 A1 | 1/2007 | Hoshikawa et al. |
| 2012/0231379 A1* | 9/2012 | Nukada ............ G03G 5/14726 430/56 |
| 2015/0065624 A1 | 3/2015 | Tsuda et al. |
| 2015/0344366 A1* | 12/2015 | Iruya ...................... C04B 16/04 524/4 |
| 2016/0222220 A1 | 8/2016 | Hoshikawa et al. |
| 2017/0130009 A1 | 5/2017 | Hosoda et al. |

FOREIGN PATENT DOCUMENTS

| EP | 3 078 716 A1 | 10/2016 |
| JP | 2005-142572 | 6/2005 |
| JP | 2007-31 4720 A | 12/2007 |
| JP | 2008-260864 A | 10/2008 |
| JP | 2011-089074 A | 5/2011 |
| JP | 2011-252054 | 12/2011 |
| JP | 2008260864 | * 4/2013 |
| JP | 2013-227550 | 11/2013 |
| JP | WO 2015083730 | * 6/2015 |
| JP | WO2016/017801 | 2/2016 |
| WO | WO 2007/007422 A1 | 1/2007 |

OTHER PUBLICATIONS

International Search Report dated Sep. 5, 2017 in PCT/JP2017/026552, filed on Jul. 21, 2017 (with English Translation).

*Primary Examiner* — Gregory Listvoyb
(74) *Attorney, Agent, or Firm* — Oblon, McClelland, Maier & Neustadt, L.L.P.

(57) ABSTRACT

To provide a liquid composition whereby a resin powder can be uniformly dispersed in a resin or the like without being scattered, and a method for producing a film, a laminate or the like by using the liquid composition. The liquid composition comprises a liquid medium and a resin powder dispersed in the liquid medium, and characterized in that the average particle size of the resin powder is from 0.3 to 6 μm, the volume-based cumulative 90% diameter of the resin powder is at most 8 μm, and the resin powder is a resin containing a fluorinated copolymer having a specific functional group. And, the method is a method for producing a film, a laminate or the like by using the liquid composition.

22 Claims, No Drawings

LIQUID COMPOSITION, AND METHOD FOR PRODUCING A FILM AND A LAMINATE BY USING THE LIQUID COMPOSITION

TECHNICAL FIELD

The present invention relates to a liquid composition, and a method for producing a film and a laminate by using the liquid composition.

BACKGROUND ART

In recent years, along with weight reduction, miniaturization and high densification of electronic products, demand for various printed circuit boards has been expanded. As a printed circuit board, for example, one prepared by laminating a metal foil on a substrate made of an insulating material such as polyimide and patterning the metal foil to form a circuit, is used. The printed circuit board is required to have excellent electrical characteristics (a low dielectric constant, etc.) corresponding to the frequency in a high frequency band, and excellent heat resistance to withstand solder reflow.

As a material having a low dielectric constant and being useful for a printed circuit board, a film has been proposed which comprises a resin composition having a fluoropolymer fine powder consisting of polytetrafluoroethylene and having an average particle size of from 0.02 to 5 µm filled in a polyimide (Patent Document 1). In the production of the film, the fluoropolymer fine powder is mixed to a polyamic acid solution to form a liquid composition, and the liquid composition is applied on a flat surface, dried and then heated to imidize the polyamic acid.

Further, as a material useful for a printed circuit board, a laminate has been proposed wherein a layer comprising a resin powder containing a fluorinated copolymer having a functional group such as a carbonyl group-containing group and having an average particle size of from 0.02 to 50 µm, and a cured product of a thermosetting resin, is formed on a metal foil (Patent Document 2). In the production of the laminate, the resin powder is dispersed in a solution containing the thermosetting resin to form a liquid composition, and the liquid composition is applied to the surface of the metal foil or the like, dried and then cured.

PRIOR ART DOCUMENTS

Patent Documents

Patent Document 1: JP-A-2005-142572
Patent Document 2: WO2016/017801

DISCLOSURE OF INVENTION

Technical Problem

In each of the production methods in Patent Documents 1 and 2, the fluorinated polymer fine powder before mixing to the polyamic acid solution, or the resin powder before mixing to a solution containing a thermosetting resin, is handled as a powder. However, if handled as a powder, at the time of being put into a mixing container or a reaction container, the powder is likely to be scattered and to adhere to the wall surface of the container, and at the time of being mixed to other liquid, it is likely to form lumps and tends to be difficult to be uniformly dispersed. In a mass production process, it is important that such a powder is preliminarily made in a state of a dispersion, so that it can be put into a mixing container or a reaction container through a piping line.

An object of the present invention is to provide a liquid composition having a resin powder dispersed in a liquid medium. Further, another object is to provide a method for producing a film or laminate by using the liquid composition.

Solution to Problem

The present invention has the following constructions.
[1] A liquid composition comprising a liquid medium and a resin powder dispersed in the liquid medium, characterized in that the average particle size of the resin powder is from 0.3 to 6 µm, the volume-based cumulative 90% diameter of the resin powder is at most 8 µm, and the resin powder is a resin containing the following polymer (X),
Polymer (X): a fluorinated polymer having units based on tetrafluoroethylene and having at least one type of functional group selected from the group consisting of a carbonyl group-containing group, a hydroxy group, an epoxy group and an isocyanate group.
[2] The liquid composition according to [1], wherein the polymer (X) is a fluorinated copolymer having units based on tetrafluoroethylene and units having said functional group.
[3] The liquid composition according to [1] or [2], wherein the polymer (X) is a fluorinated copolymer which further has units based on a perfluoro(alkyl vinyl ether).
[4] The liquid composition according to any one of [1] to [3], wherein the liquid composition further contains a surfactant.
[5] The liquid composition according to any one of [1] to [4], wherein the liquid composition further contains a powder of a resin made of a polymer other than the polymer (X), or an inorganic filler.
[6] A film containing the following fluorinated copolymer in an amount of at least 80 mass % to the total amount of the film, wherein the thermal expansion (contraction) change ratio (the ratio x/y of x-direction (large thermal expansion (contraction) rate) to y-direction (small thermal expansion (contraction) rate)) is from 1.0 to 1.3,
Fluorinated copolymer: a fluorinated copolymer having units based on tetrafluoroethylene and units having at least one type of functional group selected from the group consisting of a carbonyl group-containing group, a hydroxy group, an epoxy group and an isocyanate group.
[7] The film according to [6], wherein the number of optical heterogeneous substances of at least 20 µm in an area of 10 cm$^2$ is at most 20.
[8] The film according to [6] or [7], wherein the arithmetic average roughness Ra of the surface of the film is at least 2.0 µm.
[9] A laminate comprising a substrate and a layer made of the film as defined in any one of [6] to [8] on one surface or both surfaces of the substrate.
[10] The laminate according to [9], wherein the substrate is a metal substrate, and the thickness of the film layer is at most 15 µm.
[11] The laminate according to [9] or [10], of which the warpage is at most 25%.
[12] An interlayer insulating film, a solder resist or a cover lay film having a layer made of the film as defined in [6].
[13] A method for producing a film, characterized by removing the liquid medium at the same time as film-forming the liquid composition as defined in any one of [1] to [5].

[14] The production method according to [13], wherein the film-forming is conducted by impregnation to a reinforcing fiber substrate.
[15] The production method according to [13] or [14], wherein the dielectric constant of the film is from 2.0 to 3.5.
[16] A method for producing a laminate characterized by removing the liquid medium at the same time as film-forming the liquid composition as defined in any one of [1] to [5] on a substrate, to form a resin layer laminated on the substrate.
[17] The production method according to [16], wherein the arithmetic average roughness Ra of the exposed surface of the resin layer is at least 2.0 μm.
[18] The production method according to [16] or [17], wherein after removal of the liquid medium, heating is conducted by applying, while injecting an inert gas, heat radiation emitted toward one surface from a heating plate to radiate far infrared rays.
[19] The production method according to any one of [16] to [18], wherein after forming the resin layer, the surface of the resin layer is subjected to plasma treatment.
[20] The production method according to any one of [16] to [19], wherein the dielectric constant of the resin layer is from 2.0 to 3.5.
[21] The production method according to any one of [16] to [20], wherein the substrate is a metal substrate.
[22] A method for producing a laminate, characterized by producing a laminate having a resin layer on at least one surface by the method as defined in any one of [16] to [21], and then laminating the obtained laminate with a second substrate by using the resin layer surface as the lamination surface.
[23] The production method according to [22], wherein the second substrate is a prepreg, and the matrix resin of the prepreg is a thermoplastic resin having a melting point of at most 280° C. or a thermosetting resin having a thermosetting temperature of at most 280° C., and the lamination is conducted by heat-pressing at a temperature of from 120 to 300° C.
[24] A method for producing a printed circuit board, characterized by forming a pattern by etching the metal layer of the laminate having the metal layer on at least one surface, produced by the production method as defined in any one of [16] to [23].

Advantageous Effects of Invention

By using the liquid composition of the present invention, it is possible to uniformly disperse a resin powder in a resin or its raw material without scattering the resin powder. Further, according to the production method of the present invention using the above-mentioned liquid composition, it is possible to obtain a film or laminate, having defects due to non-uniformity of dispersion of the resin powder suppressed.

DESCRIPTION OF EMBODIMENTS

The meanings of the following terms in this specification are as follows.
The "dielectric constant" is a value measured by the SPDR (Spirit post dielectric resonator) method under an environment in a range of 23° C.±2° C. and RH of 50±5%, at a frequency of 2.5 GHz.
A "unit" in a polymer means an atomic group derived from one molecule of a monomer, formed by polymerization of the monomer. A unit may be an atomic group formed directly by the polymerization reaction, or may be an atomic group having a portion of the atomic group converted to another structure by treating the polymer obtained by the polymerization reaction.
A "(meth)acrylate" is a general term for an acrylate and a methacrylate.
The "arithmetic average roughness (Ra)" is an arithmetic average roughness to be measured based on JIS B0601: 2013 (ISO4287: 1997, Amd. 1: 2009). At the time of obtaining Ra, the standard length lr (cut-off value λc) for the roughness curve was set to be 0.8 mm.

[Liquid Composition]

The liquid composition of the present invention is a liquid composition comprising a liquid medium and a resin powder dispersed in the liquid medium, wherein the resin powder contains the after-described polymer (X). In addition, the average particle size of the resin powder is from 0.3 to 6 μm, and the volume-based cumulative 90% diameter (D90) of the resin powder is at most 8 μm.

The liquid medium being a dispersion medium is an inert component liquid at room temperature and made of an inorganic solvent such as water, an organic solvent, etc. The liquid medium is preferably one which has a boiling point lower than other components contained in the liquid composition, and which can be volatilized and removed by heating, etc.

The resin powder may contain a polymer other than the polymer (X).

Further, the liquid composition may have components other than the liquid medium and the above resin powder. For example, a component to improve the dispersion stability such as a surfactant, a filler made of inorganic particles, non-meltable organic particles, etc., a powder of a resin different from the resin in the above resin powder, a curable or non-curable resin dissolved in the liquid medium, etc. may be mentioned.

As other components to be contained in the liquid composition of the present invention, a surfactant and a filler are particularly preferred.

The polymer (X) is a fluorinated polymer containing units (hereinafter referred to as "TFE" units) based on tetrafluoroethylene (hereinafter referred to as "TFE") and having at least one type of functional group (hereinafter referred to also as "functional group (i)") selected from the group consisting of a carbonyl group-containing group, a hydroxy group, an epoxy group and an isocyanate group.

The functional group (i) may be contained in a unit in the polymer (X), and in such a case, the unit having the functional group (i) may be a unit having fluorine atom(s) or a unit having no fluorine atom. Hereinafter, a unit having functional group (i) may be referred to also as "unit (1)". The unit (1) is preferably a unit having no fluorine atom.

Further, the functional group (i) may be contained in a terminal group of the main chain of the polymer (X), and in such a case, the polymer (X) may or may not have the unit (1). The terminal group having the functional group (i) is a terminal group derived from a polymerization initiator, a chain transfer agent, etc., and the terminal group having the functional group (i) is formed by using a polymerization initiator or a chain transfer agent which has the functional group (i) or which forms the functional group (i) during the reaction to form the polymer. Otherwise, after forming a polymer, It is also possible to introduce the functional group (i) at its terminal group. As the functional group (i) to be contained in the terminal group, an alkoxycarbonyl group, a carbonate group, a carboxy group, a fluoroformyl group, an acid anhydride residue or a hydroxy group is preferred.

The polymer (X) is preferably a copolymer having units (1) and TFE units. And in such a case, the polymer (X) may further have units other than units (1) and TFE units, as the case requires. The units other than units (1) and TFE units are preferably perfluoro units such PAVE units, HFP units, etc. as described later.

Hereinafter, the present invention will be described with reference to the polymer (X) being a copolymer having units (1) and TFE units.

The carbonyl group-containing group for the functional group (i) is not particularly limited so long as it is a group containing a carbonyl group in its structure, and, for example, a group having a carbonyl group between carbon atoms of a hydrocarbon group, a carbonate group, a carboxy group, a haloformyl group, an alkoxycarbonyl group, an acid anhydride residue, a polyfluoroalkoxy carbonyl group, a fatty acid residue, etc. may be mentioned. Among them, from the viewpoint of improvement of mechanical pulverization properties and improvement of fusion properties with a metal, a group having a carbonyl group between carbon atoms of a hydrocarbon group, a carbonate group, a carboxy group, a haloformyl group, an alkoxycarbonyl group and an acid anhydride residue are preferred, and a carboxy group and an acid anhydride residue are more preferred.

The hydrocarbon group in the group having a carbonyl group between carbon atoms of a hydrocarbon group, may, for example, be an alkylene group having from 2 to 8 carbon atoms. Here, the number of carbon atoms in the alkylene group is the number of carbon atoms in the portion other than the carbonyl group in the alkylene group. The alkylene group may be linear or branched.

The haloformyl group is a group represented by —C(=O)—X (where X is a halogen atom). As the halogen atom in the haloformyl group, a fluorine atom, a chlorine atom, etc. may be mentioned, and a fluorine atom is preferred. That is, as the haloformyl group, a fluoroformyl group (referred to also as a carbonyl fluoride group) is preferred.

The alkoxy group in the alkoxycarbonyl group may be linear or branched. As the alkoxy group, an alkoxy group having from 1 to 8 carbon atoms is preferred, and a methoxy group or an ethoxy group is particularly preferred.

The units (1) are preferably units based on a monomer having the functional group (i) (hereinafter referred to also as "monomer (m1)"). The number of the functional group (i) which the monomer (m1) has, may be one, or two or more. In a case where the monomer (m1) has two or more functional groups (i), such functional groups (i) may, respectively, be the same or different.

The monomer (m1) is preferably a compound having one functional group (i) and one polymerizable double bond.

As the monomer (m1), one type may be used alone, or two or more types may be used in combination.

Among monomers (m1), a monomer having a carbonyl group-containing group, may, for example, be a cyclic hydrocarbon compound having an acid anhydride residue and a polymerizable unsaturated bond (hereinafter referred to also as "monomer (m11)"), a monomer having a carboxy group (hereinafter referred to also as "monomer (m12)"), a vinyl ester, a (meth)acrylate, $CF_2=CFOR^{f1}COOX^1$ (where $R^{f1}$ is a $C_{1-10}$ perfluoroalkylene group which may have an etheric oxygen atom, and $X^1$ is a hydrogen atom or an alkyl group having from 1 to 3 carbon atoms), etc.

The monomer (m11) may, for example, be an acid anhydride of an unsaturated dicarboxylic acid, etc. The acid anhydride of an unsaturated dicarboxylic acid may, for example, be itaconic anhydride (hereinafter referred to also as "IAH"), citraconic anhydride (hereinafter referred to also as "CAH"), 5-norbornene-2,3-dicarboxylic anhydride (another name: himic anhydride, hereinafter referred to also as "NAH"), maleic anhydride, etc.

The monomer (m12) may, for example, be an unsaturated dicarboxylic acid such as itaconic acid, citraconic acid, 5-norbornene-2,3-dicarboxylic acid, maleic acid, etc., an unsaturated monocarboxylic acid such as acrylic acid, methacrylic acid, etc.

The vinyl ester may, for example, be vinyl acetate, vinyl chloroacetate, vinyl butanoate, vinyl pivalate, vinyl benzoate, etc.

The (meth)acrylate may, for example, be a (polyfluoroalkyl) acrylate, a (polyfluoroalkyl) methacrylate, etc.

The monomer containing a hydroxy group may, for example, be a compound which is a vinyl ester, a vinyl ether, an allyl ether or an unsaturated carboxylic acid ester (a (meth)acrylate, a crotonic acid ester, etc.) and which has at least one hydroxy group at the terminal or in the side chain, or an unsaturated alcohol. Specifically, for example, 2-hydroxyethyl (meth)acrylate, 2-hydroxyethyl crotonate, allyl alcohol, etc. may be mentioned.

The monomer containing an epoxy group may, for example, be an unsaturated glycidyl ether (e.g. allyl glycidyl ether, 2-methylallyl glycidyl ether, vinyl glycidyl ether, etc.), an unsaturated glycidyl ester (e.g. glycidyl acrylate, glycidyl methacrylate, etc.), etc.

The monomer containing an isocyanate group may, for example, be 2-(meth)acryloyloxyethyl isocyanate, 2-(2-(meth)acryloyloxyethoxy) ethyl isocyanate, 1,1-bis((meth)acryloyloxymethyl) ethyl isocyanate, etc.

From the viewpoint of improvement of mechanical pulverization properties and improvement of fusion properties with a metal, units (1) preferably have at least a carbonyl group-containing group as the functional group (i). The monomer (m1) is preferably a monomer having a carbonyl group-containing group.

The monomer having a carbonyl group-containing group is preferably the monomer (m11) from the viewpoint of the thermal stability and fusion properties with a metal. Among them, IAH, CAH and NAH are particularly preferred. By using at least one of IAH, CAH and NAH, it is possible to easily produce a fluorinated polymer having an acid anhydride group without using a special polymerization method which is required when using maleic anhydride (JP-A-11-193312). Among IAH, CAH and NAH, from such a viewpoint that adhesion will be more excellent, NAH is preferred.

The polymer (X) may have, as units other than units (1) and TFE units, units (hereinafter referred to as "PAVE units") based on a perfluoro(alkyl vinyl ether) (hereinafter referred to also as "PAVE").

PAVE may, for example, be $CF_2=CFOR^{f2}$ (where $R^{f2}$ is a $C_{1-10}$ perfluoroalkyl group which may have an etheric oxygen atom). The perfluoroalkyl group for $R^{f2}$ may be linear or branched. The number of carbon atoms in $R^{f2}$ is preferably from 1 to 3.

$CF_2=CFOR^{f2}$ may be $CF_2=CFOCF_3$, $CF_2=CFOCF_2CF_3$, $CF_2=CFOCF_2CF_2CF_3$ (hereinafter referred to also as "PPVE"), $CF_2=CFOCF_2CF_2CF_2CF_3$, $CF_2=CFO(CF_2)_8F$, etc., and PPVE is preferred.

As PAVE, one type may be used alone, or two or more types may be used in combination.

The polymer (X) may have, as units other than units (1) and TFE units, units (hereinafter referred to as "HFP units") based on hexafluoropropylene (hereinafter referred to also as "HFP").

The polymer (X) may have, as units other than units (1) and TFE units, units (hereinafter referred to as "other units") other than PAVE units and HFP units.

Such other units may be units based on a fluorinated monomer (but excluding the monomer (m1), TFE, PAVE and HFP), or units based on a non-fluorinated monomer (but excluding the monomer (m1)).

The above fluorinated monomer is preferably a fluorinated compound having one polymerizable double bond, and may, for example, be a fluoro-olefin (but excluding TFE and HFP) such as vinyl fluoride, vinylidene fluoride, trifluoroethylene or chlorotrifluoroethylene, $CF_2=CFORf^3SO_2X^3$ (where $Rf^3$ is a $C_{1-10}$ perfluoroalkylene group or a $C_{2-10}$ perfluoroalkylene group containing an etheric oxygen atom, and $X^3$ is a halogen atom or a hydroxy group), $CF_2=CF(CF_2)_pOCF=CF_2$ (where p is 1 or 2), $CH_2=CX^4(CF_2)_qX^5$ (where $X^4$ is a hydrogen atom or a fluorine atom, q is an integer of from 2 to 10, and $X^5$ is a hydrogen atom or a fluorine atom), a perfluoro(2-methylene-4-methyl-1,3-dioxolane), etc. One of them may be used alone, or two or more of them may be used in combination.

As the above fluorinated monomer, vinylidene fluoride, chlorotrifluoroethylene and $CH_2=CX^4(CF_2)_qX^5$ are preferred.

As $CH_2=CX^4(CF_2)_qX^5$, $CH_2=CH(CF_2)_2F$, $CH_2=CH(CF_2)_3F$, $CH_2=CH(CF_2)_4F$, $CH_2=CF(CF_2)_3H$, $CH_2=CF(CF_2)_4H$, etc. may be mentioned, and $CH_2=CH(CF_2)_4F$ or $CH_2=CH(CF_2)_2F$ is preferred.

As the above non-fluorinated monomer, a non-fluorinated compound having one polymerizable double bond is preferred, and, for example, an olefin having at most three carbon atoms, such as ethylene or propylene, may be mentioned. One of them may be used alone, or two or more of them may be used in combination.

As the monomer (m42), ethylene or propylene is preferred, and ethylene is particularly preferred.

As the above fluorinated monomer and the above non-fluorinated monomer, one type may be used alone or two or more types may be used in combination, respectively. Further, the above fluorinated monomer and the above non-fluorinated monomer may be used in combination.

As the polymer (X), the after-described polymer (X-1) and polymer (X-2) are preferred, and the polymer (X-1) is particularly preferred.

The polymer (X-1) is a copolymer having units (1), TFE units and PAVE units, wherein to the total of all units, the proportion of units (1) is from 0.01 to 3 mol %, the proportion of TFE units is from 90 to 99.89 mol %, and the proportion of PAVE units is from 0.1 to 9.99 mol %.

The polymer (X-1) may further have at least one of HFP units and other units, as the case requires. The polymer (X-1) may be one consisting of units (1), TFE units and PAVE units, may be one consisting of units (1), TFE units, PAVE units and HFP units, may be one consisting of units (1), TFE units, PAVE units and other units, or may be one consisting of units (1), TFE units, PAVE units, HFP units and other units.

The polymer (X-1) is preferably a copolymer having units based on a monomer containing a carbonyl group-containing group, TFE units and PAVE units, particularly preferably a copolymer having units derived from monomer (m11), TFE units and PAVE units. Specific examples of preferred polymer (X-1) include a TFE/PPVE/NAH copolymer, a TFE/PPVE/IAH copolymer, a TFE/PPVE/CAH copolymer, etc.

The polymer (X-1) may have the functional group (i) as a terminal group. The functional group (i) can be introduced by suitably selecting a radical polymerization initiator, a chain transfer agent, etc. to be used in the production of the polymer (X-1).

The proportion of units (1) to the total of all units constituting the polymer (X-1) is from 0.01 to 3 mol %, preferably from 0.03 to 2 mol %, particularly preferably from 0.05 to 1 mol %. When the content of units (1) is at least the lower limit value in the above range, a resin powder with a large bulk density tends to be easily obtainable. Further, a film or the like formed by the liquid composition will be excellent in the interlayer adhesion to other material (such as a metal). When the content of units (1) is at most the upper limit value in the above range, the heat resistance, color, etc. of the polymer (X-1) will be excellent.

The proportion of TFE units to the total of all units constituting the polymer (X-1) is from 90 to 99.89 mol %, preferably from 95 to 99.47 mol %, particularly preferably from 96 to 98.95 mol %. When the content of TFE units is at least the lower limit value in the above range, the polymer (X-1) will be excellent in electric characteristics (low dielectric constant, etc.), heat resistance, chemical resistance, etc. When the content of TFE units is at most the upper limit value in the above range, the polymer (X-1) will be excellent in melt-moldability, stress crack resistance, etc.

The proportion of PAVE units to the total of all units constituting the polymer (X-1) is from 0.1 to 9.99 mol %, preferably from 0.5 to 9.97 mol %, particularly preferably from 1 to 9.95 mol %. When the content of PAVE units is within the above range, the polymer (X-1) will be excellent in moldability.

The proportion of the total of units (1), TFE units and PAVE units to the total of all units in the polymer (X-1) is preferably at least 90 mol %, more preferably at least 95 mol %, further preferably at least 98 mol %. The upper limit of the proportion is not particularly limited, and may be 100 mol %.

The contents of the respective units in the polymer (X-1) can be measured by an NMR analysis such as a molten nuclear magnetic resonance (NMR) analysis, a fluorine content analysis, an infrared absorption spectrum analysis, etc. For example, as described in JP-A-2007-314720, by using a method such as an infrared absorption spectrum analysis, it is possible to obtain the proportion (mol %) of units (1) in all units constituting the polymer (X-1).

The polymer (X-2) is a copolymer (but excluding the polymer (X-1)) having units (1), TFE units and HFP units, wherein to the total of all units, the proportion of units (1) is from 0.01 to 3 mol %, the proportion of TFE units is from 90 to 99.89 mol %, and the proportion of HFP units is from 0.1 to 9.99 mol %.

The polymer (X-2) may further have PAVE units or other units, as the case requires. The polymer (X-2) may be one consisting of units (1), units (2) and HFP units, may be one consisting of units (1), TFE units, HFP units and PAVE units (but excluding the polymer (X-1)), may be one consisting of units (1), TFE units, HFP units and other units, or may be one consisting of units (1), TFE units, HFP units, PAVE units and other units (but excluding the polymer (X-1)).

The polymer (X-2) is preferably a copolymer having units based on a monomer containing a carbonyl group-containing group, TFE units and HFP units, particularly preferably a copolymer having units based on monomer (m11), TFE units and HFP units. Specific examples of preferred polymer (X-2) include a TFE/HFP/NAH copolymer, a TFE/HFP/IAH copolymer, a TFE/HFP/CAH copolymer, etc.

Further, the polymer (X-2) may have, like the polymer (X-1), a terminal group having the functional group (i).

The proportion of units (1) to the total of all units constituting the polymer (X-2) is from 0.01 to 3 mol %, preferably from 0.02 to 2 mol %, particularly preferably from 0.05 to 1.5 mol %. When the content of units (1) is at least the lower limit value in the above range, a resin powder having a large bulk density tends to be easily obtainable. Further, a film or the like formed by the liquid composition will be excellent in the interlayer adhesion to other material (such as a metal). When the content of units (1) is at most the upper limit value in the above range, the polymer (X-2) will be excellent in heat resistance, color, etc.

The proportion of TFE units to the total of all units constituting the polymer (X-2) is from 90 to 99.89 mol %, preferably from 91 to 98 mol %, particularly preferably from 92 to 96 mol %. When the content of TFE units is at least the lower limit value in the above range, the polymer (X-2) will be excellent in electric characteristics (low dielectric constant, etc.), heat resistance, chemical resistance, etc. When the content of TFE units is at most the upper limit value in the above range, the polymer (X-2) will be excellent in melt-moldability, stress cracking resistance, etc.

The proportion of HFP units to the total of all units constituting the polymer (X-2) is from 0.1 to 9.99 mol %, preferably from 1 to 9 mol %, particularly preferably from 2 to 8 mol %. When the content of HFP units is within the above range, the polymer (X-2) will be excellent in moldability.

The proportion of the total of units (1), TFE units and HFP units in the total of all units in the polymer (X-2) is preferably at least 90 mol %, more preferably at least 95 mol %, further preferably at least 98 mol %. The upper limit of the proportion is not particularly limited, and may be 100 mol %.

The melting point of the polymer (X) is preferably from 260 to 380° C. When the melting point of the polymer (X) is at least 260° C., the heat resistance will be excellent. When the melting point of the polymer (X) is at most 380° C., the moldability will be excellent. Particularly a problem such as surface irregularities due to particles after the molding is less likely to occur.

Further, the polymer (X) is preferably melt-moldable. Here, "melt-moldable" means to show melt flowability. "To show melt flowability" means that under a load of 49N and at a temperature higher by at least 20° C. than the melting point of the resin, there is a temperature at which the melt flow rate becomes to be from 0.1 to 1,000 g/10 min. The "melt flow rate" means a melt mass flow rate (MFR) as stipulated in JIS K7210: 1999 (ISO 1133: 1997). The melting point of the melt-moldable polymer (X) is more preferably from 260 to 320° C., further preferably from 280 to 320° C., particularly preferably from 295 to 315° C., most preferably from 295 to 310° C. When the melting point of the polymer (X) is at least the lower limit value in the above range, the heat resistance will be excellent. When the melting point of the polymer (X) is at most the upper limit value in the above range, the melt moldability will be excellent.

Here, the melting point of the polymer (X) can be adjusted by the types and contents of units constituting the polymer (X), the molecular weight, etc. For example, as the proportion of TFE units is increased, there is a tendency that the melting point becomes higher.

MFR of the polymer (X) is preferably from 0.1 to 1,000 g/10 min., more preferably from 0.5 to 100 g/10 min., further preferably from 1 to 30 g/10 min., particularly preferably from 5 to 20 g/10 min. When MFR is at least the lower limit value in the above range, the polymer (X) will be excellent in moldability, and a film or the like formed by using the liquid composition will be excellent in surface smoothness and appearance. When MFR is at most the upper limit value in the above range, the polymer (X) will be excellent in mechanical strength, and a film or the like formed by using the liquid composition will be excellent in mechanical strength.

MFR is an index for the molecular weight of the polymer (X), i.e. the larger the MFR, the smaller the molecular weight, and the smaller the MFR, the larger the molecular weight. The molecular weight of the polymer (X), i.e. MFR, can be adjusted by conditions for producing the polymer (X). For example, if the polymerization time is shortened in the polymerization of the monomer, MFR tends to be large.

The dielectric constant of the polymer (X) is preferably at most 2.5, more preferably at most 2.4, particularly preferably from 2.0 to 2.4. As the dielectric constant of the polymer (X) is low, the electrical characteristics of a film or the like formed by using the liquid composition will be more excellent, and, for example, excellent transmission efficiency can be obtained in the case of using the film as a substrate for a printed circuit board.

The dielectric constant of the copolymer (X) can be adjusted by the content of TFE units.

The polymer (X) may be prepared by a conventional method. As a method for producing the polymer (X), for example, a method described in [0053] to [0060] of WO2016/017801 may be mentioned.

The resin powder may contain a polymer other than the polymer (X).

The polymer other than the polymer (X) which may be contained in the resin powder is not particularly limited so long as it does not impair the characteristics of the electrical reliability, and may, for example, be a fluorinated polymer other than the polymer (X), an aromatic polyester, a polyamideimide, a thermoplastic polyimide, etc. As such a polymer, from the viewpoint of electrical reliability, a fluorinated polymer other than the polymer (X) is preferred. As such a polymer, one type may be used alone, or two or more types may be used in combination.

The fluorinated copolymer other than the polymer (X) may, for example, be polytetrafluoroethylene (hereinafter referred to also as "PTFE"), a TFE/PAVE copolymer (but excluding the polymer (X)), a TFE/HFP copolymer (but excluding the polymer (X)), an ethylene/TFE copolymer, etc. As the fluorinated polymer other than the polymer (X), from the viewpoint of heat resistance, one having a melting point of at least 280° C. is preferred.

The resin powder is preferably composed mainly of the polymer (X). When the polymer (X) is the main component, a resin powder with a high bulk density can be easily obtainable. The larger the bulk density of the resin powder, the better the handling efficiency. Here, the resin powder being "composed mainly of the polymer (X)" means that the proportion of the polymer (X) to the total amount of the resin powder is at least 80 mass %. The proportion of the polymer (X) to the total amount of the resin powder is preferably at least 85 mass %, more preferably at least 90 mass %, particularly preferably 100 mass %.

The average particle size of the resin powder is from 0.3 to 6 μm, preferably from 0.4 to 5 μm, more preferably from 0.5 to 4.5 μm, further preferably from 0.7 to 4 μm, particularly preferably from 1 to 3.5 μm. When the average particle size of the resin powder is at least the lower limit value in the above range, the flowability of the resin powder will be sufficient, whereby handling will be easy, and since the average particle size is small, it is possible to increase the filling rate of the resin powder to a thermoplastic resin or the like. The higher the filling rate, the better the electrical characteristics (the low dielectric constant, etc.) of a film or the like formed by using the liquid composition. Further, as the average particle size of the resin powder is smaller, it is possible to reduce the thickness of a film formed by using the liquid composition, and, for example, it is easy to make the thickness to be useful for application to a flexible printed circuit board. When the average particle size of the resin powder is at most the upper limit value in the above range, the dispersibility of the resin powder in the liquid medium will be excellent.

The average particle size of the resin powder is the volume-based cumulative 50% diameter (D50) obtainable by a laser diffraction scattering method. That is, the particle size distribution is measured by a laser diffraction scattering method, and a cumulative curve is obtained by setting the total volume of the population of particles as 100%, whereby D50 is the particle diameter at a point where the cumulative volume becomes 50% on the cumulative curve.

The volume-based cumulative 90% diameter (D90) of the resin powder is at most 8 μm, preferably at most 6 μm, particularly preferably from 1.5 to 5 μm. When D90 is at most the upper limit value, the dispersibility of the resin powder in the liquid medium will be excellent.

D90 of the resin powder is obtainable by a laser diffraction scattering method. That is, the particle size distribution is measured by a laser diffraction scattering method, and a cumulative curve is obtained by setting the total volume of the population of particles as 100%, whereby D90 is the particle diameter at a point where the cumulative volume becomes 90% on the cumulative curve.

The loosely packed bulk density of the resin powder is preferably at least 0.05 g/mL, more preferably from 0.05 to 0.5 g/mL, particularly preferably from 0.08 to 0.5 g/m L.

The densely packed bulk density of the resin powder is preferably at least 0.05 g/mL, more preferably from 0.05 to 0.8 g/mL, particularly preferably from 0.1 to 0.8 g/m L.

The larger the loosely packed bulk density or the densely packed bulk density, the better the handling efficiency of the resin powder becomes. Further, it is possible to increase the filling rate of the resin powder to a thermoplastic resin or the like. When the loosely packed bulk density or the densely packed bulk density is at most the upper limit value in the above range, the resin powder can be used in common processes.

As a method for producing the resin powder, a method may be mentioned wherein a powder material containing the polymer (X) obtained by polymerization or the polymer (X) commercially available, is pulverized, as the case requires, and classified (sieved, etc.) to obtain a resin powder having an average particle size of from 0.3 to 6 μm and D90 of at most 8 μm. In a case where the polymer (X) is produced by solution polymerization, suspension polymerization or emulsion polymerization, the pulverization and classification (sieving, etc.) are carried out after recovering particulate polymer (X) by removing an organic solvent or aqueous medium used for the polymerization. In a case where the polymer (X) obtained by the polymerization has an average particle size of from 0.3 to 6 μm and D90 of at most 8 μm, the polymer (X) may be use as it is, as the resin powder.

In a case where the resin powder contains a polymer other than the polymer (X), it is preferred that such a polymer and the polymer (X) are melt-kneaded, and then pulverized and classified.

As the pulverization method and classification method for the powder material, the methods described in [0065] to [0069] of WO2016/017801 may be employed.

As the resin powder, if a desired resin powder is commercially available, such a commercial product may be used.

The liquid medium in the liquid composition of the present invention consists of an inorganic solvent such as water, an organic solvent, etc. The liquid medium may be a mixture of compatible two or more liquid media. For example, it may be a mixture of a water-soluble organic solvent and water, or may be a mixture of two or more organic solvents.

The boiling point of the liquid medium is preferably at most 270° C., and a liquid medium having a boiling point of from 70 to 260° C. is preferred.

As the inorganic solvent, water is preferred.

As the organic solvent, a known liquid medium may be used, and, for example, an alcohol such as ethanol, a nitrogen-containing compound such as N,N-dimethylacetamide or N-methyl-2-pyrrolidone, a sulfur-containing compound such as dimethyl sulfoxide, an ether such as diethyl ether or dioxane, an ester such as ethyl acetate, a ketone such as methyl ethyl ketone, a glycol ether such as ethylene glycol monoisopropyl ether, a cellosolve such as methyl cellosolve, etc., may be mentioned.

Here, the liquid medium is a compound that does not react with the polymer (X).

As the organic solvent, specific examples thereof include the following organic solvents.

γ-Butyrolactone, acetone, methyl ethyl ketone, hexane, heptane, octane, 2-heptanone, cycloheptanone, cyclohexanone, cyclohexane, methylcyclohexane, ethylcyclohexane, methyl-n-pentyl ketone, methyl isobutyl ketone, methyl isopentyl ketone.

Ethylene glycol, diethylene glycol, propylene glycol, dipropylene glycol, ethylene glycol monoacetate, ethylene glycol monomethyl ether acetate, ethylene glycol monoethyl ether acetate, diethylene glycol monoacetate, diethylene glycol diethyl ether, propylene glycol monoacetate, dipropylene glycol monoacetate, propylene glycol diacetate, propylene glycol monomethyl ether, propylene glycol monomethyl ether acetate, propylene glycol monoethyl ether acetate, cyclohexyl acetate, ethyl 3-ethoxypropionate, dioxane, methyl lactate, ethyl lactate, methyl acetate, ethyl acetate, butyl acetate, methyl pyruvate, ethyl pyruvate, methyl methoxypropionate, ethyl ethoxypropionate.

Anisole, ethylbenzyl ether, cresyl methyl ether, diphenyl ether, dibenzyl ether, phenetole, butyl phenyl ether, benzene, ethylbenzene, diethylbenzene, pentylbenzene, isopropylbenzene, toluene, xylene, cymene, mesitylene.

Methanol, ethanol, isopropanol, butanol, methyl monoglycidyl ether, ethyl monoglycidyl ether, dimethylformamide, mineral spirits, N,N-dimethylformamide, N,N-dimethylacetamide, N-methyl-2-pyrrolidone.

Perfluorocarbons, hydrofluoroethers, hydrochlorofluorocarbons, hydrofluorocarbons, perfluoropolyethers, various silicone oils.

The content of the liquid medium in the liquid composition of the present invention, is preferably from 1 to 1,000 parts by mass, more preferably from 10 to 500 parts by mass, particularly preferably from 30 to 250 parts by mass, to 100 parts by mass of the resin powder. When the content of the liquid medium is within the above range, coating properties at the time of film forming as described later will be good. Further, when the content of the liquid medium is at most the upper limit value in the above range, as the amount of the liquid medium to be used is small, defective appearance of a film product derived from the step of removing the liquid medium will be less likely to occur.

The liquid composition of the present invention may contain a surfactant. The surfactant is not particularly limited, and a nonionic surfactant, an anionic surfactant, a cationic surfactant, etc. may be mentioned. Among them, as the surfactant, a nonionic surfactant is preferred. As the surfactant, one type may be used alone, or two or more types may be used in combination.

The surfactant in the present invention is required to be one having at least a fluorinated group and a hydrophilic group, and it is not particularly limited so long as it is one having at least a fluorinated group and a hydrophilic group, and it may be one containing a lipophilic group in addition. By using a fluorine-based additive having at least a fluorinated group and a hydrophilic group, it is possible to decrease the surface tension of the solvent to be a dispersion medium, to improve the wettability to a fluororesin surface thereby to improve the dispersibility of a fluororesin, and at the same time, the fluorinate group is adsorbed on the fluororesin surface, and the hydrophilic group is extended in the liquid medium as a dispersion medium, whereby by steric hindrance of the hydrophilic group, coagulation of the fluororesin will be prevented, and the dispersion stability will be further improved. The fluorinated group may, for example, be a perfluoroalkyl group, a perfluoroalkenyl group, etc., the hydrophilic group may, for example, be one or more of ethylene oxide, propylene oxide, an amino group, a ketone group, a carboxy group, a sulfonic group, etc., and the lipophilic group may, for example, be one or more of an alkyl group, a phenyl group, a siloxane group, etc.

The fluorine-based additives that can specifically be used, include perfluoroalkyl group-containing Ftergent M-series, Ftergent F-series, Ftergent G-series, Ftergent P•D-series, Ftergent 710FL, Ftergent 710FM, Ftergent 710FS, Ftergent 730FL, Ftergent 730LM, Ftergent 610FM, Ftergent 601AD, Ftergent 601ADH2, Ftergent 602A, Ftergent 650AC, Ftergent 681 (manufactured by Neos Company Limited), SURFLON series such as SURFLON S-386 (manufactured by AGC Seimi Chemical Co., Ltd.), MEGAFACE series such as MEGAFACE F-553, MEGAFACE F-555, MEGAFACE F-556, MEGAFACE F-557, MEGAFACE F-559, MEGAFACE F-562, MEGAFACE F-565, etc. (manufactured by DIC Corporation), and UNIDYNE series such as UNIDYNE DS-403N, etc. (manufactured by Daikin Industries, Ltd.). Among such surfactants, the most suitable one is selected for use depending upon the types of the fluororesin and the solvent to be used, but it is also possible to use one type, or two or more types in combination. In the case of using two or more types of surfactants in combination, at least one type is required to be one having a fluorinated group and a hydrophilic group, and the remaining types may not contain a fluorinated group.

To the liquid composition of the present invention, it is possible to further incorporate a silicone-based anti-foaming agent or a fluorosilicone-based anti-foaming agent. As the anti-foaming agent that can be used, a silicone- or fluorosilicone-based emulsion type, self-emulsifying type, oil-type, oil compound type, solution type, powder type, solid type, etc. may be mentioned, and depending upon the combination with the liquid medium to be used, the most suitable one is selected for use. The content of the anti-foaming agent varies depending on e.g. the content (concentration) of the resin powder, etc., but, it is preferably at most 1 mass % as an active ingredient to the total amount of the liquid composition.

In a case where the liquid composition of the present invention contains a surfactant, the content of the surfactant in the liquid composition is, to 100 parts by mass of the resin powder, preferably from 0.1 to 20 parts by mass, more preferably from 0.2 to 10 parts by mass, particularly preferably from 0.3 to 7 parts by mass. When the content of the surfactant is at least the lower limit value in the above range, it will be easy to obtain excellent dispersibility. When the content of the surfactant is at most the upper limit value in the above range, it will be possible to obtain characteristics of the resin powder without being affected by the properties of the surfactant. For example, it will be possible to lower the dielectric constant and the dielectric loss tangent of a film or the like formed by using the liquid composition of the present invention.

The liquid compositions of the present invention may contain a filler. When the liquid composition of the present invention contains a filler, it will be possible to lower the dielectric constant and the dielectric loss tangent of a film or the like formed by using the liquid composition of the present invention. As the filler, an inorganic filler is preferred, and ones described in [0089] of WO2016/017801 may be mentioned. As the inorganic filler, one type may be used alone, or two or more types may be used in combination.

Further, the after-described powder consisting of fine particles of a non-heat-meltable resin (cured product of PTFE or thermosetting resin, etc.) can be regarded as an organic filler, and as the organic filler, a powder of PTFE is particularly preferred.

In a case where the liquid composition of the present invention contains a filler, the content of the filler in the liquid composition is, to 100 parts by mass of the resin powder, preferably from 0.1 to 300 parts by mass, more preferably from 1 to 200 parts by mass, further preferably from 3 to 150 parts by mass, particularly preferably from 5 to 100 parts by mass, most preferably from 10 to 60 parts by mass. As the content of the filler increases, the linear expansion coefficient (CTE) of the obtainable film will be lowered, and the thermal dimensional properties of the film will be excellent. Further, the dimensional change in the heating process tends to be small, and the molding stability will be excellent.

The liquid composition of the present invention may contain a powder of a resin other than the polymer (X), or a curable or non-curable resin dissolved in the liquid medium. A resin other than the polymer (X), which is a resin insoluble in the liquid medium, will be contained as fine particles (i.e. as a resin powder) in the liquid composition. Such a resin insoluble in the liquid medium and a curable or non-curable resin dissolved in the liquid medium will be hereinafter collectively referred to as "second resin".

The second resin insoluble in the liquid medium may be a non-curable resin or may be a curable resin.

The non-curable resin may be a heat-meltable resin or a non-meltable resin. The non-curable resin may have a reactive group capable of reacting with the functional group (i) of the polymer (X). The heat-meltable resin may, for example, be a fluororesin made of a fluoropolymer other than the polymer (X), a thermoplastic polyimide, etc. The non-meltable resin may be PTFE or a cured product of a curable resin, and fine particles thereof can also be regarded as a filler.

The curable resin may be a polymer having a reactive group, an oligomer (low polymer) having a reactive group, a low-molecular compound, a low-molecular compound having a reactive group, etc. The curable resin is a resin curable by a reaction among its own reactive groups, by a reaction with the functional group (i) of the polymer (X), by a reaction with a curing agent, etc. As the curable resin, a thermosetting resin is preferred. The curable resin is preferably cured after the liquid medium is removed from the liquid composition of the present invention.

The reactive group may be a carbonyl group-containing group, a hydroxy group, an amino group, an epoxy group, etc.

The second resin may, for example, be a thermoplastic polyimide, a thermosetting polyimide, a polyamic acid which is a precursor thereof, etc. The polyamic acid usually has a reactive group capable of reacting with the functional group (i) of the polymer (X). The thermoplastic polyimide, etc. may not have a reactive group capable of reacting with the functional group (i).

As the diamine and polycarboxylic acid dianhydride to form a polyamic acid, for example, those described in [0020] of Japanese Patent No. 5766125, in [0019] of Japanese Patent No. 5766125, in [0055] and [0057] of JP-A-2012-145676, etc. may be mentioned. Among them, a combination of an aromatic diamine such as 4,4'-diaminodiphenyl ether or 2,2-bis[4-(4-aminophenoxy)phenyl]-propane, and an aromatic polycarboxylic acid dianhydride such as pyromellitic dianhydride, 3,3',4,4'-biphenyltetracarboxylic acid dianhydride, or 3,3',4,4'-benzophenone tetracarboxylic acid dianhydride, is preferred. As the diamine and polyhydric carboxylic acid dianhydride or derivatives thereof, one type may be used alone, or two or more types may be used in combination, respectively.

In the case of a heat-meltable second resin or a second resin which becomes a heat-meltable resin upon curing, such a heat-meltable resin is preferably one having a melting point of at least 280° C. In a film or the like formed by the liquid composition, it will be thereby easy to suppress swelling (foaming) due to heat when exposed to an atmosphere corresponding to solder reflow.

The second resin may also be a resin made of a non-heat-meltable polymer. A non-meltable resin such as PTFE or a non-heat-meltable resin such as a resin made of a cured product of a thermosetting resin, is a resin non-meltable in the liquid medium, and will be dispersed as fine particles in the liquid medium, like the above-mentioned, inorganic filler.

The thermosetting resin may be an epoxy resin, an acrylic resin, a phenolic resin, a polyester resin, a polyolefin resin, a modified polyphenylene ether resin, a polyfunctional cyanic acid ester resin, a polyfunctional maleimide-cyanic acid ester resin, a polyfunctional maleimide resin, a vinyl ester resin, a urea resin, a diallyl phthalate resin, a melamine resin, a guanamine resin, a melamine-urea co-condensation resin, a fluororesin having a reactive group (but excluding the polymer (X)), etc. From the viewpoint of usefulness for application to printed circuit boards, as the thermosetting resin, an epoxy resin, an acrylic resin, a bismaleimide resin, or a modified polyphenylene ether resin is preferred, and an epoxy resin, or a modified polyphenylene ether resin is particularly preferred. As the thermosetting resin, one type may be used alone, or two or more types may be used in combination.

The epoxy resin is not particularly limited so long as it is an epoxy resin to be used to form various substrate materials for printed circuit boards. Specifically, a naphthalene type epoxy resin, a cresol novolak type epoxy resin, a bisphenol A type epoxy resin, a bisphenol F type epoxy resin, a bisphenol S type epoxy resin, an alicyclic epoxy resin, an aliphatic chain epoxy resin, a cresol novolak type epoxy resin, a phenol novolak type epoxy resin, an alkylphenol novolac epoxy resin, an aralkyl type epoxy resin, a biphenol type epoxy resin, a dicyclopentadiene type epoxy resin, a trishydroxyphenylmethane type epoxy compound, an epoxidized product of a condensate of a phenol and an aromatic aldehyde having a phenolic hydroxyl group, a diglycidyl etherified product of bisphenol, a diglycidyl etherified product of naphthalene diol, a diglycidyl etherified product of a phenol, a diglycidyl etherified product of an alcohol, triglycidyl isocyanurate, etc. may be mentioned. Further, in addition to the above mentioned, various glycidyl ether type epoxy resins, glycidyl amine type epoxy resins, glycidyl ester type epoxy resins, and oxidized epoxy resins may also be used, and as others, it is also possible to use phosphorus-modified epoxy resins, etc. As the epoxy resin, one type may be used alone, or two or more types may be used in combination. In particular, from the viewpoint of excellent curing properties, it is preferred to use an epoxy resin having two or more epoxy groups in one molecule.

The weight average molecular weight of the epoxy resin is preferably from 100 to 1,000,000, more preferably from 1,000 to 100,000. When the weight average molecular weight of the epoxy resin is within the above range, a film or the like formed by the liquid composition will be excellent in interlayer adhesion to other material (such as a metal).

The weight average molecular weight of the epoxy resin is measured by gel permeation chromatography (GPC).

The bismaleimide resin may be a resin composition (BT resin) having a bisphenol A type cyanate ester resin and a bismaleimide compound used in combination, as described in JP-A-H7-70315, or ones described in the invention or its background art in WO2013/008667.

In a case where a thermosetting resin is used as the second resin, the liquid composition of the present invention may contain a curing agent. The curing agent may be a thermal curing agent (a melamine resin, a urethane resin, etc.), an epoxy curing agent (a phenolic novolak resin, isophthalic acid dihydrazide, adipic acid dihydrazide, etc.), etc.

The content of the resin powder in the liquid composition of the present invention is, to 100 parts by mass of the second resin, preferably from 5 to 500 parts by mass, more preferably from 10 to 400 parts by mass, particularly preferably from 20 to 300 parts by mass. When the content of the resin powder is at least the lower limit value in the above range, a film or the like formed by using the liquid composition will be excellent in electric characteristics. When the content of the resin powder is at most the upper limit value in the above range, the resin powder will be easily uniformly dispersed in the liquid composition, and the film or the like formed by using the liquid composition will also be excellent in mechanical strength.

In a case where the liquid composition of the present invention contains a second resin, the content of the liquid medium in the liquid composition is, to 100 parts by mass in total of the resin powder and the second resin, preferably from 1 to 1,000 parts by mass, more preferably from 10 to 500 parts by mass, particularly preferably from 30 to 250 parts by mass. When the content of the liquid medium is at least the lower limit value in the above range, the viscosity of the liquid composition will not be too high, and the after-described coating properties during film-forming will be good. When the content of the liquid medium is at most the upper limit value in the above range, the viscosity of the liquid composition will not be too low, and the coating properties during film-forming will be good, and since the amount of the liquid medium to be used is small, poor appearance of the film-forming product due to the process of removing the liquid medium will be less likely to occur.

Further, in a case where the second resin is blended with a liquid medium (e.g. in a case where a dispersion or solution of the second resin is incorporated to a composition comprising the resin powder and a liquid medium), the content of the liquid medium in the liquid composition is the content having such liquid media totaled.

In a case where the liquid composition of the present invention contains a curing agent, the content of the curing agent in the liquid composition is, to the amount of reactive groups possessed by the thermosetting resin, preferably from 0.5 to 2.0 equivalents, more preferably from 0.8 to 1.2 equivalents.

The method for producing the liquid composition of the present invention is not particularly limited, and may, for example, be a method of mixing and stirring the resin powder, other components to be used as the case requires, and the liquid medium. As the means for mixing and stirring, it is preferred to use, for example, a dispersing machine such as a homomixer, a high-speed stirrer, an ultrasonic disperser, a homogenizer, a wet ball mill, a bead mill, a wet jet mill, etc.

In a case where the liquid composition of the present invention contains a surfactant, i.e. in the case of the liquid composition of the present invention containing a surfactant, the resin powder, the surfactant and the liquid medium may be dispersed by means of a dispersing machine, whereby it is possible to obtain a stable liquid composition which is excellent in storage stability and in redispersibility after long-term storage, wherein the average particle size of the resin powder in the dispersed state as measured by a dynamic light scattering method, is as fine as from 0.3 to 6 μm.

By using the liquid composition of the present invention, as compared with the case of handling a resin powder as a powder, it is possible to uniformly disperse it in a thermoplastic resin or the like without scattering the resin powder.

Further, in the liquid composition of the present invention, the resin powder having the average particle size and D90 controlled to be within the specific ranges is dispersed in a liquid medium, whereby it is excellent in dispersibility. Therefore, at the time of forming a film, laminate or the like by using the liquid composition of the present invention, it is possible to prevent a trouble such as decrease in electrical characteristics or decrease in bonding strength to other substrate due to non-uniformity in dispersion of the resin powder in such formation.

In a case where the liquid composition of the present invention contains a filler as other component, the liquid composition of the present invention can be produced by dispersing a powder of the filler together with the resin powder to the liquid medium. A dispersion of the filler may be blended together with the resin powder in the liquid medium, or a dispersion of the filler and a dispersion of the resin powder may be mixed. As the liquid medium in the dispersion of the filler, the above mentioned liquid medium can be used. In a case where liquid media are different as between the dispersion of the filler or a non-heat-meltable resin and the dispersion of the resin powder, such liquid media may be compatible to each other.

In a case where other component is a second resin which is a resin insoluble in the liquid medium, the liquid composition of the present invention can be produced by dispersing a powder of the second resin in the liquid medium together with the resin powder. Otherwise, it may be produced also by mixing a dispersion of the second resin having preliminarily dispersed in a liquid medium, with a dispersion of the resin powder, or by dispersing the resin powder to a dispersion of the second resin.

In a case where the second resin is a resin soluble in the liquid medium, the liquid composition of the present invention can be produced by blending and dissolving the second resin in a dispersion of the resin powder. It can be produced also by mixing a solution of the second resin with the dispersion, or it can also be produced by dispersing the resin powder to the solution.

The method for mixing the dispersion of the resin powder and a liquid containing other components is not particularly limited, and, for example, a method of using a known stirring machine may be mentioned. In the case of incorporating a filler, curing agent, etc. to the liquid composition, they may be added to the dispersion before mixing, may be added to a liquid containing other components prior to mixing, or may be added to a mixed liquid after mixing.

The liquid composition of the present invention may be used for the production of, for example, a later-described film, fiber reinforced film, prepreg or laminate.

Further, the liquid composition of the present invention may also be used for the formation of an insulating layer for a flat conductor. For example, at the time of forming an insulating layer composed mainly of any resin selected from polyamideimide, polyimide and polyester imide, by using a liquid composition having the liquid composition of the present invention incorporated to an insulating coating material as a liquid containing such a resin, it is possible to lower the dielectric constant of the insulating layer. Lowering of the dielectric constant of the insulating layer can be achieved also by a paint having the resin powder added to an insulating coating material, but, in view of dispersibility, it is preferred to use a liquid composition having the liquid composition of the present invention incorporated to an insulating coating material. As a specific example of the insulating layer, for example, an insulating film described in JP-A-2013-191356 may be mentioned.

Further, the liquid composition of the present invention may be used to form a seamless belt. For example, by using a liquid composition having the liquid composition of the present invention incorporated to a liquid containing a polyimide resin and a conductive filler, it is possible to provide a seamless belt excellent in conveyance of a recording medium (paper) and excellent in cleanability. A seamless belt excellent in conveyance of a recording medium and excellent in cleanability is also obtainable by one having the resin powder added to a liquid containing a polyimide resin and a conductive filler, but, in view of dispersibility, it is preferred to use a liquid composition having the liquid composition of the present invention incorporated to the above liquid. As the seamless belt, for example, one described in JP-A-2011-240616 may be mentioned.

[Method for Producing Film]

The method for producing a film of the present invention is characterized by removing the liquid medium at the same time as film-forming the liquid composition of the present invention. The film-forming method is preferably coating on a support surface, and a film made of the liquid composition will be formed by coating on a support. After the film of the liquid composition is formed, the liquid medium is evaporated by a method such as heating the film of the liquid composition, to form a solid film having the liquid medium removed or a non-flowable film having at least a portion of the liquid medium removed. Hereinafter, removal of the liquid medium will be referred to also as "drying", and the coating operation will be referred to also as "coating".

The method for film-forming the liquid composition is not particularly limited, and, for example, a known wet coating method such as a spraying method, a roll coating method, a spin coating method, a bar coating method, a gravure coating method, a micro gravure coating method, a gravure offset method, a knife coating method, a kiss coating method, a bar coating method, a die coating method, a Fountain Mayer bar method, a slot die coating method, may be mentioned.

In drying, it is not necessarily required to completely remove the liquid medium, and drying may be carried out until the coating film can maintain its film form stably. In drying, it is preferred to remove at least 50 mass % out of the liquid medium contained in the liquid composition.

The method for drying is not particularly limited, and may, for example, be a method of heating by an oven, a method of heating by a continuous drying furnace, or a method of heating by heat ray irradiation with infrared rays, etc.

The drying temperature may be within a range where air bubbles will not occur when the liquid medium is removed, and it is, for example, preferably from 50 to 250° C., more preferably from 70 to 220° C.

The drying time is preferably from 0.1 to 30 minutes, more preferably from 0.5 to 20 minutes.

Drying may be carried out in one stage, or it may be carried out in at least two stages at different temperatures.

As the method for producing a film of the present invention, it is preferred to melt the polymer (X) by heating the film subsequently after drying or by heating the film continuously after drying. By melting the polymer (X), individual particles of the resin powder can be melted and integrated to form a homogeneous resin film. In a case where the liquid composition of the present invention has a filler, it is possible to obtain a resin film having the filler uniformly dispersed. In a case where the liquid composition of the present invention contains a heat-meltable second resin, it is possible to produce a resin film made of a melt blend of the polymer (X) and the second resin. In the case of containing a thermosetting second resin, it is possible to produce a resin film made of the polymer (X) and a cured product of the second resin. Heating of the resin film is not limited to heating from the exposed surface of the film, and it is possible to conduct heating from the support side. Further, the heating to melt the polymer (X) may also be carried out under pressure, and by melting under heating and pressurizing, it is possible to form a more uniform film.

The heating method for melting the polymer (X) may be oven heating, hot wire irradiation heating, heating by a continuous drying furnace, heating by a hot plate or hot roll, etc.

Heating for melting the polymer (X) may also be carried out in a closed system. In drying of a coating film in which the liquid medium is present, the vaporized liquid medium must be removed from the film, and therefore, one side of the film needs to be an open surface. On the other hand, in heating after the liquid medium has been sufficiently removed from the film, removal of the liquid medium is not required, and therefore, it is possible to produce a highly homogeneous film, for example, by pressing it between two heated plates.

The heating temperature for melting the polymer (X) is preferably from 270 to 400° C., more preferably from 310 to 370° C.

The heating time is preferably from 1 to 300 minutes, more preferably from 3 to 60 minutes.

In particular, a heat ray irradiation heating method using far-infrared rays with an effective waveband of from 2 to 20 μm is preferred as a method of obtaining a molten resin film, which brings about homogeneous melting of the resin, and whereby remaining of insufficiently molten particles is less. The effective wavelength band of the far-infrared rays for irradiation is more preferably from 3 to 7 μm. Further, it is also possible to conduct heating by combining far-infrared ray heating and hot air heating.

Further, heat treatment can be carried out more efficiently if the heating is conducted by emitting heat radiation towards the film surface from the heating plate emitting the far-infrared rays, while injecting an inert gas. Also in a case where heating is carried out from the support side, it is likewise preferred to inject an inert gas to the film surface. Further, in a case where the heating target is oxidized, it is preferred to adjust the oxygen concentration in the atmosphere on the film surface side to be from 500 ppm to 100 ppm, more preferably from 300 ppm to 200 ppm when radiating far infrared rays.

Depending on the application of a film such that the film produced by the production method of the present invention is to be used as a material for a laminate as described below, the film may be in such a state that the polymer (X) in the resin powder in the liquid composition of the present invention is not sufficiently melted. Such a film may be used for an application where the film is heated to become a homogeneous polymer (X). Further, also in the case of the liquid composition of the present invention containing a second resin, depending on the application of the film (such as in the case of the production of a prepreg as will be described later), the second resin may not be sufficiently melted, and a curable resin such as a thermosetting resin may not be sufficiently cured.

In the case of a film to be used for other than the above applications, it is preferred that a meltable second resin is melted and homogenized, and a curable resin is sufficiently cured. For example, in the case of a polyamic acid, heating after drying is preferably conducted at a temperature where the polyamic acid becomes a polyimide (e.g. from 350 to 550° C.), and, for example, in the case of an epoxy resin, it is preferably heated to its curing temperature (e.g. from 50 to 250° C.).

By separating a film formed on a support from the support, the film is obtainable. As the support, by using a support having a non-adherent surface, it can be easily separated. In the case of a support having an adherent surface, it is preferred to use a support having surface-treatment, etc. applied to reduce the adherency. In the case of a support having a highly adherent surface, it may be removed by a means to dissolve the support. For example, in the case of a metal support, it is possible to remove the support by etching, etc.

The film obtainable by the method for producing a film of the present invention can be used to produce a metal laminate and a printed circuit board. As the film to be used in such applications, a film containing only the resin powder and the liquid medium, or a film obtainable from the liquid composition further containing a surfactant, is preferred. In some cases, it may be the liquid composition containing a filler.

Further, depending on the method for producing a film of the present invention, it is also possible to produce a film so-called a fiber-reinforced film or prepreg as will be described later. Further, by the same method as the method for producing a film of the present invention except that the film is not separated from the support, it is also possible to produce a laminate. In the method for producing a laminate of the present invention, the support not separated will be called a substrate.

Excluding the later-described fiber-reinforced film or prepreg (i.e. excluding one containing reinforcing fibers), the thickness of the film to be produced by the production method of the present invention, is preferably from 1 to 3,000 μm. In the case of the application to printed circuit boards, the thickness of the film is more preferably from 3 to 2,000 μm, more preferably from 5 to 1,000 μm, particularly preferably from 6 to 500 μm.

The dielectric constant of the above film is preferably from 2.0 to 3.5, particularly preferably from 2.0 to 3.0. When the dielectric constant is at most the upper limit value in the above range, it is useful for an application where a low dielectric constant is required as for the application for printed circuit boards. When the dielectric constant is at least the lower limit value in the above range, the film is excellent in both adhesion fusibility and electrical properties.

Excluding the later-described fiber-reinforced film or prepreg, in the film to be produced by the production method of the present invention, x/y being the ratio (hereinafter referred to also as the thermal expansion (contraction) change ratio) of the thermal expansion (contraction) rate in the MD direction (the coating direction of the liquid composition) to that in the TD direction (the direction vertical to the MD direction) is preferably from 1.0 to 1.4, more preferably from 1.0 to 1.3. When x/y is within the above range, warpage will be prevented when forming a metal laminate and a printed circuit board, such being preferred. Here, the thermal expansion (contraction) change ratio is the ratio of x-direction (large thermal expansion (contraction) rate) to y-direction (small thermal expansion (contraction) rate) and is represented by "x/y".

Further, the above film has an arithmetic average roughness Ra of the surface being preferably less than the resin thickness and at least 2.0 μm. It is thereby possible to obtain excellent adhesion between the film and the laminate object, when the laminate object such as a prepreg is bonded to the surface by heat pressing.

Ra is preferably from 2.0 to 30 μm, more preferably from 2.1 to 10 μm, further preferably from 2.2 to 5 μm. When Ra is at least the lower limit value in the above range, adhesion between the film and the laminate object will be excellent. When Ra is at most the upper limit value in the above range, through-holes are less likely to be formed in the film.

By the method for producing a film of the present invention, the liquid composition of the present invention is impregnated to a reinforcing fiber substrate placed on a support, dried and then heated, whereby it is possible to produce a fiber-reinforced film.

The reinforcing fibers may be inorganic fibers, metal fibers, organic fibers, etc.

The inorganic fibers may be carbon fibers, graphite fibers, glass fibers, silicon carbide fibers, silicon nitride fibers, alumina fibers, silicon carbide fibers, boron fibers, etc.

The metal fibers may be aluminum fibers, brass fibers, stainless steel fibers, etc.

The organic fibers may be aromatic polyamide fibers, polyaramide fibers, polyparaphenylene benzoxazole (PBO) fibers, polyphenylene sulfide fibers, polyester fibers, acrylic fibers, nylon fibers, polyethylene fibers, etc.

As the reinforcing fibers to form the reinforcing fiber substrate, glass fibers, aramid fibers and carbon fibers are preferred. As the reinforcing fibers, carbon fibers are particularly preferred from the viewpoint of the small specific gravity, high strength, and high elastic modulus. The reinforcing fibers may be ones having surface treatment applied. As the reinforcing fibers, one type may be used alone, or two or more types may be used in combination.

The reinforcing fibers may be ones having surface treatment applied. Further, in the application for printed circuit boards, as the reinforcing fibers, glass fibers are preferred.

As the form of the reinforcing fiber substrate, one processed into a sheet form is preferred from the viewpoint of the mechanical properties of the fiber reinforced film. Specifically, for example, a cloth made by weaving reinforcing fiber bundles comprising a plurality of reinforcing fibers, a substrate having a plurality of reinforcing fibers aligned unidirectionally, one having such substrates stacked, etc. may be mentioned. The reinforcing fibers need not be continuous over the entire length in the longitudinal direction or over the entire width in the width direction of the reinforcing fiber sheet, and they may be divided in the middle.

As the reinforcing fibers, continuous long fibers with a length of at least 10 mm are preferred. The reinforcing fibers need not be continuous over the entire length in the longitudinal direction or over the entire width in the width direction of the reinforcing fiber sheet, and they may be divided in the middle.

After the liquid composition of the present invention is impregnated to a reinforcing fiber substrate, it is dried to remove at least a portion of the liquid medium and further heated. Drying and heating after the impregnation, can be conducted as described above. In the fiber-reinforced film, the resin derived from the resin powder contained therein may not be sufficiently melted so long as the shape of the fiber-reinforced film is maintained. Such a fiber-reinforced film may be used as a molding material, and it is possible to produce a molded product by heating and pressing at the same time as molding.

The fiber-reinforced film obtainable by the production method of the present invention may be used to produce a metal laminate and a printed circuit board.

The thickness of the fiber-reinforced film is preferably from 1 to 3,000 μm. In the case of the application to a printed circuit board, the thickness of the fiber-reinforced film is more preferably from 3 to 2,000 μm, further preferably from 5 to 1,000 μm, particularly preferably from 6 to 500 μm.

The dielectric constant of the fiber-reinforced film is preferably from 2.0 to 3.5, particularly preferably from 2.0 to 3.0. When the dielectric constant is at most the upper limit value in the above range, it is useful for an application where a low dielectric constant is required, such as the application to a printed circuit board. When the dielectric constant is at least the lower limit value in the above range, it is excellent in both of electrical characteristics and fusibility.

By the film production method of the present invention, the liquid composition of the present invention is impregnated to a reinforcing fiber substrate placed on a support and dried, whereby it is possible to produce a prepreg. The production of a prepreg may be conducted in the same manner as the above-described production of a fiber-reinforced film, except that it can be carried out without heating after drying or without sufficient heating. That is, the prepreg is a film comprising reinforcing fibers, a non-melted (or not sufficiently melted) resin powder and an uncured curable resin being a second resin.

The liquid composition to be used in the production of a prepreg, contains an uncured curable resin as the second resin. The uncured curable resin is preferably a thermosetting resin which is in a solid state at normal temperature. In the case of a thermosetting resin which is in a liquid state at normal temperature, it may be partially cured by heating after drying in the production of a prepreg, to become a thermally curable solid resin.

In drying in the production of a prepreg, the liquid medium may be left. In the prepreg, it is preferred that at least 70 mass % of the liquid medium contained in the liquid composition is removed.

In a case where the liquid composition of the present invention contains a thermosetting resin as the second resin, it is preferred to carry out the heating after drying at a temperature at which the thermosetting resin will not be cured, since the thermosetting resin is easily cured by the heating after drying. However, there may be a case where, as described above, it is preferred to let it be partially cured. In such a case, usually the polymer (X) will not be melted, and therefore, in the case of curing the prepreg, it is preferred to carry out the curing at a temperature at which the polymer (X) will be melted.

The prepreg obtained by the production method of the present invention can be used as a molding material, and a molded product can be produced by heating and pressing at the same time as molding. For example, it can be used to produce a metal laminate and a printed circuit board. Further, the prepreg obtainable by the production method of the present invention may also be used for an application other than an electronic component such as a printed circuit board. For example, it may be used also as a material for a sheet pile which is required to be durable and light in weight in quay construction, or a material to produce a member for a variety of applications, such as aircrafts, automobiles, ships, wind turbines, sports equipment, etc.

The dielectric constant of the prepreg is preferably from 2.0 to 4.0, particularly preferably from 2.0 to 3.5. When the dielectric constant is at most the upper limit value in the above range, it is useful for an application where a low dielectric constant is required, such as the application to a printed circuit board. When the dielectric constant is at least the lower limit value in the above range, it will be excellent in both of electrical characteristics and fusibility.

[Method for Producing Laminate]

The method for producing a laminate of the present invention is characterized by film-forming the liquid composition of the present invention on a substrate and at the same time, removing the liquid medium to form a resin layer laminated on the substrate.

This production method corresponds to such a method that in the above-mentioned method for producing a film, after drying, or after drying and heating, without separating the support and the film, a laminate comprising the film and the support is obtained. In the method for producing a laminate, the portion corresponding to the support is called a substrate, and the portion corresponding to the film is called a "resin layer". The resin layer may be the portion corresponding to the above mentioned fiber-reinforced film, or the portion corresponding to the above mentioned prepreg.

The resin layer to be formed by the method for producing a laminate of the present invention may be formed only on one surface or may be formed on both surfaces in the thickness direction of the substrate. From such a viewpoint that it will be easy to suppress warpage of the laminate and to obtain a metal laminate excellent in electrical reliability, it is preferred to form a resin layer on both surfaces of the substrate. The resin layer is preferably in a film-form.

In the case of forming a resin layer on both surfaces of the substrate, it is preferred that after conducting application and drying of the liquid composition on one surface of the substrate, application and drying of the liquid composition on the other surface is conducted. With respect to the heating after drying, it may be conducted after conducting application and drying of the liquid composition against both surfaces of the substrate, or after conducting from application to heating of the dispersion or the liquid composition against one surface of the substrate, from application to heating of the liquid composition may be conducted against the other surface.

The thickness of the resin layer in the laminate is preferably from 0.5 to 30 μm in a case where the filler contained in the resin layer is less than 10 vol %. In the case of an application to a printed circuit board, the thickness of the resin layer is more preferably from 0.5 to 25 μm, further preferably from 1 to 20 μm, particularly preferably from 2 to 15 μm. In the preferred ranges, the warpage of the laminate will be suppressed. In a case where the filler contained in the resin layer is at least 10 vol %, the thickness of the resin layer is preferably from 0.5 to 3,000 μm. In the case of an application to a printed circuit board, the thickness of the resin layer is more preferably from 1 to 1,500 μm, further preferably from 3 to 500 μm, particularly preferably from 2 to 100 μm.

In the case of a laminate having a resin layer on both surfaces of the substrate, the compositions and thicknesses of the respective resin layers may be made to be the same, or may be made to be different. With a view to suppression of warping of the laminate, it is preferred that the compositions and thicknesses of the respective resin layers are made to be the same.

The dielectric constant of the resin layer is preferably from 2.0 to 3.5, particularly preferably from 2.0 to 3.0. When the dielectric constant is at most the upper limit value in the above range, it is useful for an application where a low dielectric constant is required such as the application to a printed circuit board. When the dielectric constant is at least the lower limit value in the above range, it will be excellent in both of electrical characteristics and fusibility.

Further, in a case where the substrate is made of a non-conductive material such as a heat-resistant resin, it is preferred that the dielectric constant of the entire laminate is also within the above range.

In a case where the laminate obtained by the production method of the present invention is to be used for an application of laminating a laminate object such as a film or sheet on the surface of its resin layer, in order to increase bonding strength or in order to prevent residual air bubbles, the exposed surface of the resin layer is preferably a highly smooth surface.

Here, the laminate object may be a laminate obtained by the production method of the present invention. In such a case, on the exposed surface of the resin layer, the substrate surface or the resin layer surface of another laminate will be laminated. In the case of laminating the resin surfaces each other, the lamination may be made by interposing a laminate object between the resin layer surfaces.

To increase the smoothness of the exposed surface of the resin layer, at the same time as carrying out heating after drying at a temperature capable of sufficiently performing the melting of the film, it is preferred to conduct pressing by e.g. a heating plate or heating roller.

The arithmetic average roughness Ra of the surface of the exposed surface of the resin layer of the resulting laminate is less than the thickness of the resin layer and preferably at least 2.0 μm. It is thereby possible to obtain excellent adhesiveness between the resin layer and the laminate object, when the laminate object is laminated by heat pressing or the like.

The above Ra is less than the thickness of the resin layer and preferably from 2.0 to 30 µm, more preferably from 2.0 to 15 µm, further preferably from 2.1 to 12 µm, particularly preferably from 2.1 to 10 µm, most preferably from 2.2 to 8 µm. When Ra is at least the lower limit value in the above range, adhesiveness between the resin layer and the laminate object will be excellent. When Ra is at most the upper limit value in the above range, lamination can be made without formation of through-holes in the resin layer.

Further, in a case where a laminate obtained by the production method of the present invention is to be used in an application to laminate a laminate object such as a film or sheet on the surface of its resin layer, in order to increase the bonding strength, surface treatment such as corona discharge treatment, plasma treatment, etc. may be applied to the surface of the resin layer after the production of the laminate. Particularly, plasma treatment is preferred. The surface treatment to increase the bonding strength may be conducted under known conditions.

The plasma irradiation apparatus to be used in the plasma treatment is not particularly limited, and an apparatus employing a high frequency induction system, a capacitive coupling type electrode system, a corona discharge electrode-plasma jet system, a parallel plate type, a remote plasma type, an atmospheric pressure plasma type, an ICP type high-density plasma type, or the like, may be mentioned.

The gas to be used for the plasma treatment is not particularly limited, and oxygen, nitrogen, a rare gas (argon), hydrogen, ammonia or the like may be mentioned, and a rare gas or nitrogen is preferred. One of them may be used alone, or two or more of them may be used in combination.

The atmosphere for the plasma treatment is preferably an atmosphere wherein the volume fraction of a rare gas or nitrogen gas is preferably at least 50 vol %, more preferably at least 70 vol %, further preferably at least 90 vol %, particularly preferably 100 vol %. When the volume fraction of a rare gas or nitrogen gas is at least the lower limit value, it becomes easy to renew the surface of the fluororesin film to a plasma-treated surface having an arithmetic average roughness Ra of at least 2.0 µm.

The gas flow rate in the plasma treatment is not particularly limited.

In the plasma treatment, as the treatment progresses, Ra of the film surface becomes large, but if the treatment becomes excessive, Ra which has become large once, tends to become small again. Therefore, in order that the treatment will not become excessive, the inter-electrode gap, the output of the apparatus, etc. may be adjusted to control the energy (about from 1 to 10 eV) of electrons to be generated, and the treatment time may be set.

The substrate is not particularly limited and may, for example, be a metal film, a heat-resistant resin film, a metal vapor-deposited heat-resistant resin film, etc.

The metal to constitute a metal film may suitably be selected for use depending on the application and may, for example, be copper or a copper alloy, stainless steel or its alloys, titanium or its alloys, etc. As the metal film, a copper film such as a rolled copper foil or an electrolytic copper foil is preferred. On the surface of the metal film, an anticorrosive layer (such as an oxide film of e.g. a chromate) or a heat-resistant layer may be formed. In order to improve the adhesion to the resin layer, treatment with a coupling agent, etc. may be applied to the surface of the metal film.

The thickness of the metal film is not particularly limited, and depending on the application, a thickness capable of exhibiting sufficient functions may be selected for use.

The metal vapor-deposited heat-resistant resin film may be a film having the above-mentioned metal vapor-deposited on one surface or both surfaces of the following heat-resistant resin film by a vapor deposition method such as a vacuum vapor-deposition method, a sputtering method, an ion plating method, etc.

The heat-resistant resin film is a film comprising one or more heat-resistant resins. However, the heat-resistant resin film does not contain a fluorinated polymer. The heat-resistant resin film may be a monolayer film or may be a multilayer film.

The heat-resistant resin means a polymer compound having a melting point of at least 280° C. or a polymer compound having a maximum continuous use temperature of at least 121° C. as defined in JIS C4003: 2010 (IEC 60085: 2007). As the heat-resistant resin, for example, a polyimide (an aromatic polyimide, etc.), a polyarylate, a polysulfone, a polyallyl sulfone (a polyether sulfone, etc.), an aromatic polyamide, an aromatic polyether amide, a polyphenylene sulfide, a polyaryl ether ketone, a polyamideimide, a liquid crystal polyester, etc. may be mentioned.

As the heat-resistant resin film, a polyimide film and a liquid crystal polyester film are preferred. The polyimide film may contain, as the case requires, additives within a range not to impair the effects of the present invention. Further, the liquid crystal polyester film is preferred from the viewpoint of improvement of electric characteristics. The heat-resistant resin film may have surface treatment such as corona discharge treatment, plasma treatment, etc. applied to the surface forming the resin layer.

In a case where the laminate obtainable by the production method of the present invention, is one produced from a liquid composition containing no second resin, or from a liquid composition containing a heat-fusible second resin or a second resin which becomes a heat-fusible resin, it is preferred that in the production of the laminate, a resin powder containing the polymer (X) is melted to form a laminate having a heat-fusible resin layer. Melting of the resin powder is carried out at a sufficiently high temperature so that unmelted particles will not remain, and it is also preferred to conduct heating and pressurizing at the same time.

If heating or pressurizing is insufficient, even if the entire resin powder particles are melted, there may be a case where optical inhomogeneous portions (granules, etc.) result in the resin layer formed by subsequent cooling. This is presumed to occur since crystallization or aggregation of the resin is uneven. In the present invention, such optical inhomogeneous portions will be referred to as "foreign substances". If foreign substances result, the number of foreign substances with a size exceeding 30 µm is preferably at most 20, more preferably at most 15, particularly preferably at most 10, per 10 cm$^2$. When the number of foreign substances is at most the upper limit value in the above range, the bonding strength between the resin layer and the substrate will be excellent. Formation of foreign substances may also occur in the production of a film of the present invention.

In a case where the laminate obtainable by the production method of the present invention has resin powder particles or curable second resin not sufficiently molten (e.g. in a case where the resin layer is a layer of a prepreg), the resulting laminate may be used for an application to laminate a laminate object on its resin layer surface, or to an application to produce a molded product by e.g. heating and pressurizing.

The resulting laminate may be used for the production of a molded product, or as a member for various applications. In the case of this laminate, it is also possible to laminate a laminate object on its resin layer surface by e.g. heating and pressurizing.

The resin layer in the laminate obtainable by the production method of the present invention is a resin layer containing the polymer (X), whereby it is excellent in moldability and has a high melt bonding property, and therefore, when a laminate object is laminated on its resin surface, the bonding strength at the lamination surface is high. Also in a case where a plurality of laminates obtainable by the production method of the present invention are laminated, the bonding strength at the lamination surface between the substrate surface and the resin layer, or at the lamination surface between the respective resin layers, is high.

The laminate obtainable by the production method of the present invention is preferably a laminate having a resin layer on one surface or both surfaces of a metal substrate. In particular, a laminate having a copper foil as the substrate is preferred. The resin layer may have reinforcing fibers, or may be a layer of a prepreg (i.e. a resin layer comprising reinforcing fibers and an uncured curable resin).

The laminate having a copper foil layer obtainable by the production method of the present invention may also be made to be a laminate having a plurality of copper foil layers by laminating a plurality thereof. If the laminate having such a copper foil layer has a resin layer on one or both surfaces, it is preferred to laminate a copper foil layer on the resin layer surface. The laminate having a copper foil layer obtained by the production method of the present invention, or a laminate thereof, may be used as a flexible copper-clad laminate or a rigid copper-clad laminate.

Hereinafter, with reference to the production of a laminate having a copper foil layer, the method for producing a laminate of the present invention will be further described.

The laminate having a copper foil layer can be produced, by using a copper foil as a substrate, and by applying the liquid composition of the present invention on one surface of the copper foil to form a film of the liquid composition, then removing the liquid medium by heating and drying, and subsequently heating to melt the resin powder, followed by cooling to form a uniform resin layer free from unmelted particles. It is also possible to form the resin layer on both surfaces of the copper foil as described above.

The formation, heating and drying of the film of the liquid composition, and the melting of the resin powder may be carried out under the above-described conditions. For example, in the case of conducting the heating after drying by heating by means of a hot roll, a laminate comprising an unmelted resin layer and a copper foil after drying is brought into contact with the hot roll, and transported while being irradiated with far infrared rays, to obtain a resin layer having the unmelted resin layer melted. Although the conveying speed of the roll is not particularly limited, for example, in the case of using a heating furnace with a length of 4.7 m, it is preferably from 4.7 m/min. to 0.31 m/min. In the case of using a heating furnace with a length of 2.45 m in order to heat the entire film efficiently in a further short time, it may be made to be from 4.7 m/min. to 2.45 m/min.

The heating temperature is not particularly limited, but when the residence time in the furnace is one minute, from 330 to 380° C. is preferred, and from 350 to 370° C. is more preferred. It is also possible to lower the temperature by increasing the residence time.

The thickness of the resin layer of the laminate to be produced is preferably at most 15 μm, more preferably at most 10 μm, particularly preferably at most 8 μm. When it is at most the upper limit in the above range, even in the case of an asymmetric layer structure of the resin layer/copper foil, it is possible to suppress warpage. The warpage of the laminate is preferably at most 25%, more preferably at most 15%, further preferably at most 10%, particularly preferably at most 7%. When the warpage is at most the upper limit, in the molding process at the time of processing into a printed circuit board, the handling efficiency will be excellent, and the dielectric properties as a printed circuit board will be excellent.

Further, it is possible to further suppress the warpage by using a liquid composition containing a filler such as silica, PTFE or the like, or a liquid composition containing, as a second resin, a fluororesin (but excluding the polymer (X)) such as a TFE/PAVE copolymer, a TFE/HFP copolymer, a polychlorotrifluoroethylene (hereinafter referred to also as "PCTFE"), etc.

Further, by using a liquid composition of the present invention containing a thermosetting resin as the second resin, it is also possible to produce a laminate having a copper foil layer and a resin layer comprising a cured thermosetting resin. The liquid composition may contain a filler, or by using reinforcing fibers, a fiber-reinforced resin layer may be formed. The thickness of the resin layer in such a case is preferably at most 200 μm, more preferably at most 100 μm. When the thickness of the resin layer is at most 200 μm, in drilling at the time of being processed into a printed circuit board, the processability will be excellent, and it becomes possible to form an electronic circuit excellent in connection reliability. Further, it is possible to further suppress the warpage by incorporating a filler in the resin layer.

In the production of a laminate having a copper foil layer, it is possible to reduce the linear expansion coefficient in the thickness direction (Z-direction) by conducting annealing treatment. It is thereby possible to prevent peeling at the interface between the substrate and the resin layer, or to reduce fluctuation in electrical characteristics of the substrate due to thickness unevenness in the plane of the laminate. As an annealing condition, the temperature is preferably from 80° C. to 190° C., more preferably from 100° C. to 185° C., particularly preferably from 120° C. to 180° C. The annealing time is preferably from 10 minutes to 300 minutes, more preferably from 20 minutes to 200 minutes, particularly preferably from 30 minutes to 120 minutes. When the annealing temperature and time conditions are at least the lower limit values, it is possible to sufficiently reduce the linear expansion coefficient, and when they are at most the upper limit values, it is possible to reduce the linear expansion coefficient without thermal degradation. The pressure for annealing is preferably from 0.001 MPa to 0.030 MPa, more preferably from 0.003 MPa to 0.020 MPa, particularly preferably from 0.005 MPa to 0.015 MPa. When at least the lower limit value, it is possible to reduce the linear expansion coefficient. When at most the upper limit value, it is possible to reduce the linear expansion coefficient without bringing about compression of the substrate.

By the method for producing a laminate of the present invention, it is also possible to produce a laminate using a metal substrate other than a copper foil. For example, it is possible to produce a laminate having a titanium foil and a resin layer by forming a resin layer on one surface or both surfaces of a titanium foil. The thickness of the resin layer is preferably at most 10 μm. By laminating a fiber-reinforced composite material on the resin layer side of such a laminate, it is possible to obtain a molded product with a layered structure of e.g. titanium foil/resin layer/fiber-reinforced composite material. As the fiber-reinforced composite material to be laminated, particularly preferred is a carbon fiber-reinforced composite material.

[Utilization of Film or Laminate]

A laminate having the same structure as the laminate obtainable by the method for producing a laminate of the present invention may also be produced by a method other than the method for producing a laminate of the present invention. For example, by laminating a film obtained by the above-mentioned production method of a film of the present invention, with the corresponding film or sheet of a substrate, it is possible to produce a laminate having a structure similar to the above-mentioned laminate. Further, in the method for producing a laminate of the present invention, it is difficult to produce a laminate wherein both surfaces are substrates (since it is difficult to remove the liquid medium from the liquid composition between the substrates), but by using a film obtained by the production method of a film of the present invention, it is possible to produce a laminate wherein both surfaces are substrates.

Further, it is possible to produce a laminate wherein both surfaces are substrates, also by laminating a laminate object corresponding to a substrate, on the surface of a resin layer of a laminate obtained by the method for producing a laminate of the present invention.

Hereinafter, with reference to a laminate (hereinafter referred to also as a "metal laminate") having at least one layer of each of a metal layer and a resin layer (a resin layer having the polymer (X)), a utilization example of a film or a laminate obtained by the production method of the present invention will be described.

The metal laminate may be obtained by forming a metal layer on a resin layer surface containing the polymer (X), of a film (including a fiber-reinforced film and a film of prepreg) obtained by the above-mentioned film production method of the present invention, or of a laminate obtained by the laminate production method of the present invention.

The method for forming a metal layer on one surface or both surfaces of a film or laminate, may, for example, be a method of laminating the film or laminate and a metal foil, or a method of vapor-depositing a metal on the resin layer surface of the film or laminate. The lamination method may, for example, be heat lamination or the like. The vapor-deposition method of a metal may be a vacuum vapor-deposition method, a sputtering method, an ion plating method or the like.

In the case of using a film obtainable by the production method of the present invention, the laminated structure of a metal laminate to be produced may be a film/metal layer, a metal layer/film/metal layer, or the like. Further, in the case of using a laminate obtainable by the production method of the present invention, the laminated structure of a metal laminate may be a laminate layer/metal layer, a metal layer/laminate layer/metal layer, or the like, provided that the layer in the laminate in contact with the metal layer is a resin layer.

The film or laminate obtained by the above-mentioned production method of the present invention may also be used for an application to produce a new laminate, by laminating it with a laminate object in the form of a film or sheet made of a material other than a metal. As such a laminate object, a film or sheet of a heat-resistant resin, a fiber-reinforced resin sheet, prepreg or the like, may be mentioned.

As the laminate object, a prepreg is preferred. The prepreg may be one having a matrix resin impregnated in a reinforcing fiber sheet.

The reinforcing fiber sheet may be a sheet composed of the above-mentioned reinforcing fibers.

The matrix resin may be a thermoplastic resin or may be a thermosetting resin.

The present invention is particularly effective in the case of using a thermoplastic resin having a melting point of at most 280° C. or a thermosetting resin having a thermosetting temperature of at most 280° C. as the matric resin, from the viewpoint of low temperature bonding.

As the matrix resin, one type may be used alone, or two or more types may be used in combination. Further, the matrix resin may also contain a filler as described in of WO2016/017801 or may contain the above-mentioned reinforcing fibers. Otherwise, it may contain reinforcing fibers and a filler at the same time.

In the case where the matrix resin is a thermosetting resin, it may be the same thermosetting resin as mentioned in the above description of the liquid composition. As the thermosetting resin, an epoxy resin, a polyphenylene oxide, a polyphenylene ether, or a polybutadiene is preferred.

In the case where the matrix resin is a thermoplastic resin, a polyester resin (polyethylene terephthalate, etc.), a polyolefin resin (polyethylene, etc.), a styrene-based resin (polystyrene, etc.), a polycarbonate, a polyimide (aromatic polyimide, etc.), a polyarylate, a polysulfone, a polyallyl sulfone (polyether sulfone, etc.), an aromatic polyamide, an aromatic polyether amide, a polyphenylene sulfide, a polyaryl ether ketone, a polyamideimide, a liquid crystal polyester, a polyphenylene ether, a fluororesin (but excluding the polymer (X)) such as PTFE, a TFE/PAVE copolymer, a TFE/HFP copolymer, PCTFE, etc. may be mentioned.

The temperature for heat pressing the prepreg and the film or laminate obtained by the production method of the present invention is preferably at most the melting point of the polymer (X), more preferably from 120 to 300° C., further preferably from 140 to 240° C., still more preferably from 160 to 220° C. When the heat pressing temperature is within the above range, it is possible to bond the prepreg and the film or laminate obtained by the production method of the present invention, with excellent adhesion, while suppressing thermal deterioration of the prepreg. Here, the resin layer may contain a filler and reinforcing fibers, and the laminate object may contain a filler, reinforcing fibers and the polymer (X).

Although the construction of the metal laminate comprising the above resin layer and laminate object, is not limited to the following, in a construction such as a metal layer/resin layer/laminate object/resin layer/metal layer or a metal layer/laminate object/resin layer/laminate object/metal layer, the thickness of the resin layer is preferably from 0.1 μm to 300 μm, more preferably from 0.3 μm to 150 μm, further preferably from 0.5 μm to 100 μm, still more preferably from 0.7 μm to 70 μm, still further preferably from 1 μm to 50 μm, particularly preferably from 2 μm to 40 μm. When at most the upper limit value in the above range, as a copper-clad laminate, drilling processability will be good, and dielectric properties will be excellent. When at least the lower limit value in the above range, the metal layer and the resin layer, and the laminate object and the resin layer, can be bonded with excellent adhesion.

In a case where the laminate object is made of thermoplastic resins, and among the thermoplastic resins, either one of a polyimide (aromatic polyimide, etc.), a liquid crystal polyester, PTFE, a TFE/PAVE copolymer, a TFE/HFP copolymer and PCTFE is contained in an amount of at least 50 mass %, or the above thermoplastic resins are contained, as put together, in an amount of at least 50 mass %, the temperature for heat pressing the resin layer and the laminate object is preferably from 310 to 400° C., more preferably from 320 to 380° C., further preferably from 330 to 370° C. When the heat pressing temperature is within the above range, the resin layer and the laminate object can be bonded with excellent adhesion, while suppressing thermal deterioration of the laminate object. Here, the resin layer may contain a filler and reinforcing fibers, and the laminate object may contain a filler, reinforcing fibers and the copolymer (X).

Although the construction of the metal laminate comprising the above resin layer and laminate object, is not limited to the following, in a construction such as a metal layer/resin layer/laminate object/resin layer/metal layer or a metal layer/laminate object/resin layer/laminate object/metal layer, the thickness of the resin layer is preferably from 0.1 μm to 300 μm, more preferably from 0.3 μm to 150 μm, further preferably from 0.5 μm to 100 μm, still more preferably from 0.7 μm to 70 μm, still further preferably from 1 μm to 50 μm, particularly preferably from 2 μm to 40 μm. When at most the upper limit value in the above range, as a copper-clad laminate, drilling processability will be excellent, and dielectric properties will be excellent. When at least the lower limit in the above range, the metal layer and the adhesive layer, and the laminate object and the resin layer, can be bonded with excellent adhesion.

The adhesion (peel strength) of the laminated object and the film or laminate obtained by the production method of the present invention is preferably at least 5 N/cm, more preferably at least 6 N/cm, further preferably at least 7 N/cm.

As the prepreg, a commercially available prepreg may be used.

For example, as commercially available prepregs, those having the following trade names may be mentioned.

R-G520, R-1410W, R-1410A and R-1410E in MEGTRON GX series, R-5680, R-5680(N), R-5670, R-5670(N), R-5620S, R-5620, R-5630 and R-1570 in MEGTRON series, R-1650V, R-1650D, R-1650M and R-1650E in HIPER series, manufactured by Panasonic Corporation.

GEA-770G, GEA-705G, GEA-700G, GEA-679FG, GEA-679F(R), GEA-78G, TD-002, GEA-75G, GEA-67 and GEA-67G, manufactured by Hitachi Chemical Co., Ltd.

GEPL-190T, GEPL-230T, GHPL-830X Type A, GHPL-830NS, GHPL-830NSR and GHPL-830NSF, manufactured by Mitsubishi Gas Chemical Co., Ltd.

DS-7409DV, DS-7409D(X), DS-7409DV(N), DS-7402H, DS-7409S(N), DS-7402, DS-7402M, DS-7408 (LTF), manufactured by DOOSAN CORPORATION.

SP120N, S1151G, S1151 GB, S1170G, S1170 GB, S1150G, S1150GB, S1140F, S1140FB, S7045G, SP175M, S1190, S1190B, S1170, S0701, S1141KF, S0401KF, S1000-2M, S1000-2MB, S1000-2, S1000-2B, S1000, S1000B, S1000H, S1000HB, S7136H, S7439 and S7439B, manufactured by GUANDONG Shengyi SCI. TECH.

NY1135, NY1140, NY1150, NY1170, NY2150, NY2170, NY9135, NY9140, NY9600, NY9250, NY9140 HF, NY6200, NY6150, NY3170 LK, NY6300, NY3170M, NY6200, NY3150 HF CTI600, NY3170HF, NY3150D, NY3150HF, NY2170H, NY2170, NY2150, NY2140, NY1600, NY1140, NY9815HF, NY9810HF, NY9815 and NY9810, manufactured by SHANGHAI NANYA.

IT-180GN, IT-180I, IT-180A, IT-189, IT-180, IT-258GA3, IT-158, IT-150GN, IT-140, IT-150GS, IT-150G, IT-168G1, IT-168G2, IT-170G, IT-170GRA1, IT-958G, IT-200LK, IT-200D, IT-150DA, IT-170GLE, IT-968G, IT-968G SE, IT-968 and IT-968 SE, manufactured by ITEQ CORPORATION.

UV BLOCK FR-4-86, NP-140 TL/B, NP-140M TL/B, NP-150 R/TL/B, NP-170 R/TL/B, NP-180 R/TL/B, NPG R/TL/B, NPG-151, NPG-150N, NPG-150LKHD, NPG-170N, NPG-170 R/TL/B, NPG-171, NPG-170D R/TL/B, NPG-180ID/B, NPG-180IF/B, NPG-180IN/B, NPG-180INBK/B (BP), NPG-186, NPG-200R/TL, NPG-200WT, FR-4-86 PY, FR-140TL PY, NPG-PY R/TL, CEM-3-92, CEM-3-92PY, CEM-3-98, CEM-3-01PY, CEM-3-01 HC, CEM-3-09, CEM-3-09HT, CEM-3-10, NP-LDII, NP-LDIII, NP-175R/TL/B, NP-155F R/TL/B, NP-175F R/TL/B, NP-175F BH and NP-175FM BH, manufactured by NANYA PLASTICS.

ULVP series and LDP series, manufactured by TAIWAN UNION TECHNOLOGY.

A11, R406N, P25N, TerraGreen, I-Tera MT40, IS680 AG, IS680, Astra MT77, G200, DE104, FR408, ED130UV, FR406, IS410, FR402, FR406N, IS420, IS620i, 370TURBO, 254, I-Speed, FR-408HR, IS415 and 370HR, manufactured by ISOLA GROUP.

NY9000, NX9000, NL9000, NH9000, N9000-13 RF, N8000Q, N8000, N7000-1, N7000-2 HT slash-3, N7000-3, N5000, N5000-30, N-5000-32, N4000-12, N4000-12SI, N4000-13, N4000-13SI, N4000-13SI, N4000-13EP, N4000-13EP SI, N4350-13RF, N4380-13RF, N4800-20, N4800-20SI, Meteorwave1000, Meteorwave2000, Meteorwave3000, Meteorwave4000, Mercurywave9350, N4000-6, N4000-6FC, N4000-7, N4000-7SI, N4000-11 and N4000-29, manufactured by PARK ELECTROCHEMICAL.

RO4450B, RO4450F, CLTE-P, 3001 Bonding Film, 2929 Bondply, CuClad 6700 Bonding Film, ULTRALAM 3908 Bondply, and CuClad 6250 Bonding Film, manufactured by ROGERS CORPORATION.

ES-3329, ES-3317B, ES-3346, ES-3308S, ES-3310A, ES-3306S, ES-3350, ES-3352, ES-3660, ES-3351S, ES-3551S, ES-3382S, ES-3940, ES-3960V, ES-3960C, ES-3753, ES-3305, ES-3615, ES-3306S, ES-3506S, ES-3308S, ES-3317B and ES-3615, manufactured by Risho Kogyo Co., Ltd.

A metal laminate wherein the metal layer is made of copper or a copper alloy, obtained by using a film produced by the method for producing a film of the present invention or a laminate produced by the method for producing a laminate of the present invention, is useful for the production of a printed circuit board. Also a laminate wherein the substrate is made of copper or a copper alloy, produced by the method for producing a laminate of the present invention, is useful for the production of a printed circuit board.

A printed circuit board may be obtained by forming a patterned circuit by etching the metal layer of e.g. the above metal laminate. For the etching of the metal layer, a known method may be employed.

In the production of a printed circuit board, after forming the patterned circuit by etching the metal layer, an interlayer insulating film may be formed on the patterned circuit, so that a patterned circuit may further be formed on the interlayer insulating film. The interlayer insulating film may be formed by, for example, a liquid composition obtainable by the production method of the present invention.

Specifically, for example, the following method may be mentioned. After forming a patterned circuit by etching the metal layer of the metal laminate having an optional laminated structure, the liquid composition of the present invention is applied on the patterned circuit, dried and then heated to form an interlayer insulating film. Then, a metal layer is formed on the interlayer insulating film by e.g. vapor deposition and then subjected to etching to form a further patterned circuit.

In the production of a printed circuit board, a solder resist may be laminated on the patterned circuit. The solder resist may be formed by, for example, the liquid composition of the present invention. Specifically, the liquid composition of the present invention may be applied on the patterned circuit, dried and then heated to form a solder resist.

Further, in the production of a printed circuit board, a coverlay film may be laminated. The coverlay film is typically composed of a substrate film and an adhesive layer formed on its surface, and the adhesive layer side surface is bonded to the printed circuit board. As the coverlay film, for example, a film obtained by the production method of the present invention may be used.

Further, an interlayer insulating film using a film obtained by the production method of the present invention may be formed on a patterned circuit formed by etching the metal layer of the metal laminate, and a polyimide film may be laminated as a coverlay film on the interlayer insulating film.

The obtainable printed circuit board is useful as a substrate for electronic equipment such as radars, network routers, backplanes, wireless infrastructures where high frequency characteristics are required, as a substrate for various automotive sensors, or as a substrate for engine management sensors, and it is particularly suitable for an application intended to reduce the transmission loss in a millimeter wave band.

The film or laminate obtainable by the production method of the present invention, is useful for antenna parts, printed circuit boards, aircraft parts, automobile parts, sporting equipment, food industry equipment, saws, a coated article such as a sliding bearing, etc. As further exemplification, it may also be used for applications described in [0040] to [0044] of WO2015/182702. Further, the prepreg may be used for FRP or CFRP, and in this respect, the applications as described in [0046] of WO2015/182702 may be mentioned. Further, the liquid composition of the present invention may also be used as a solution type coating material. As articles coated with such a coating material, those described in [0045] of WO2015/182702 may be mentioned. Further, it may also be used as an insulating coating material for forming an insulating layer of an insulated wire as described in Japanese Patent No. 2686148.

As the insulated wire, an insulated wire having an insulating coating layer with a thickness of from 10 to 150 μm formed on the outer circumference of a rectangular wire by using the liquid composition of the present invention, may be mentioned. The dielectric constant of the insulating coating layer is preferably at most 2.8. Further, it is preferred that the bonding strength between the insulating cover layer and the metal species to be used for the rectangular wire is at least 10 N/cm. The insulated wire is suitable for use in any of devices such as insulation amplifiers, isolation transformers, automotive alternators and motors for hybrid vehicles.

EXAMPLES

In the following, the present invention will be described specifically with reference to Examples, but the present invention is not limited by the following description. In the following Examples, including the liquid composition of the present invention, a liquid medium containing solid particles will be referred to as a "dispersion".

[Measurement Methods]

Various measuring methods with respect to the polymer (X) and the resin powder will be shown below.

(1) Copolymer Composition

In the copolymer composition of the polymer (X), the proportion (mol %) of units based on NAH was determined by the following infrared absorption spectrum analysis. The proportions of other units were determined by the melt NMR analysis and fluorine content analysis.

<Proportion (Mol %) of Units Based on NAH>

After obtaining a film having a thickness of 200 μm by press-molding a fluorinated copolymer, its infrared absorption spectrum was obtained by an analysis by infrared spectroscopy. In the infrared absorption spectrum, the absorption peak of units based on NAH in the fluorinated copolymer appears at 1,778 $cm^{-1}$. By measuring the absorbance at the absorption peak, and using the molar absorption coefficient of NAH being 20,810 $mol^{-1} \cdot l \cdot cm^{-1}$, the proportion of units based on NAH in the fluorinated copolymer was determined.

(2) Melting Point (° C.)

Using a differential scanning calorimeter (DSC apparatus) manufactured by Seiko Instruments Inc., the melting peak at the time of heating the copolymer (X) at a rate of 10° C./min. was recorded, whereby the temperature (° C.) corresponding to the maximum value was taken as the melting point (Tm).

(3) MFR (g/10 Min.)

Using a melt indexer manufactured by Techno Seven Co., the mass (g) of the copolymer (X) flowing out in 10 minutes (unit time) from a nozzle with a diameter of 2 mm and a length of 8 mm at 372° C. under a load of 49N, was measured and taken as MFR.

(4) Dielectric Constant

By the transformer bridge method in accordance with ASTM D150, in such a test environment that the temperature was maintained in the range of 23° C.±2° C. and the relative humidity was maintained in the range of 50%±5% RH, a value obtained at 1 MHz by a dielectric breakdown testing device (YSY-243-100RHO (manufactured Yamayoshikenki)) was taken as the dielectric constant.

(5) Average Particle Size of Polymer (X)

A 2.000 mesh sieve (mesh opening: 2.400 mm), a 1.410 mesh sieve (mesh opening: 1.705 mm), a 1.000 mesh sieve (mesh opening: 1.205 mm), a 0.710 mesh sieve (mesh opening: 0.855 mm), a 0.500 mesh sieve (mesh opening: 0.605 mm), a 0.250 mesh sieve (mesh opening: 0.375 mm), a 0.149 mesh sieve (mesh opening: 0.100 mm) and a saucer were stacked in this order from the top. A sample (polymer (X)) was put thereon and sieved for 30 minutes by a shaker. Thereafter, the mass of the sample remaining on each sieve was measured, and the cumulative passing mass against each sieve opening value was represented by a graph, whereby the particle size when the cumulative passing mass was 50% was taken as the average particle size of the sample.

(6) Average Particle Size and D90 of Resin Powder

Using a laser diffraction-scattering particle size distribution measuring apparatus (LA-920 measuring instrument) manufactured by Horiba Ltd., a resin powder was dispersed in water, and the particle size distribution was measured, whereupon the average particle size (μm) and D90 (μm) were calculated.

(7) Loosely Packed Bulk Density and Densely Packed Bulk Density

The loosely packed bulk density and densely packed bulk density of a resin powder were measured using the method described in [0117] and [0118] of WO2016/017801.

(8) Peel Strength of Copper Foil

From a single sided copper-clad laminate, a double-sided copper-clad laminate or a laminate obtained in each Ex., a rectangular test specimen with a length of 100 mm and a width of 10 mm was cut out. In the length direction of the specimen, from one end to the position of 50 mm, the copper foil on one side and the resin layer, or for a test specimen not using a copper foil, the resin layer and the mating member, were peeled. Then, by setting the position of 50 mm from one end in the length direction of the specimen at the center, using a tensile tester (manufactured by Orientec Co., Ltd.), 90 degree peeling was conducted at a tensile rate of 50 mm/min, whereby the maximum load was taken as the peel strength (N/10 mm). The higher the peel strength, the better the adhesion between the resin layer and the copper foil or between the resin layer and the mating member.

(9) Warpage of Single Sided Copper-Clad Laminate

A square test specimen of 180 mm square was cut out from a single sided copper-clad laminate obtained in each Ex. The warpage of this test specimen was measured in accordance with the measuring method specified in JIS C6471. As the warpage is small, in a case where the single-sided copper-clad laminate is laminated with another material, it will be possible to prevent lamination failure with another material due to warping during the lamination processing, and to obtain a printed circuit board with high flatness having warpage suppressed as a laminate.

(10) Linear Expansion Coefficient (ppm/° C.) in Thickness Direction

With respect to a sample obtained by cutting a double-sided copper-clad laminate obtained in each Ex. into 10 mm×10 mm, using a thermomechanical analyzer (manufactured by NETZSCH, TMA402 F1 Hyperion), the linear expansion coefficient CTE (z) in the thickness direction was measured. Specifically, in a nitrogen atmosphere under a load of 19.6 mN, the sample was heated at a temperature raising rate of 2° C./min. in a measuring temperature range of from −65° C. to 150° C., and the displacement amount in the thickness of the sample was measured. After the measurement, the linear expansion coefficient of from −40° C. to 125° C. was obtained from the displacement amount of the sample from −40° C. to 125° C.

(11) Arithmetic Average Roughness Ra

Ra of the surface of the resin layer of a single-sided copper clad laminate was measured in accordance with JIS B0601: 2013 (ISO4287: 1997, Amd. 1: 2009). At the time of obtaining Ra, the standard length lr (cut-off value λc) for the roughness curve was set to be 0.8 mm.

(12) Peel Strength at Interface with Prepreg

From a metal laminate obtained in each Ex., a rectangular test specimen with a length 100 mm and a width of 10 mm was cut out. The resin layer and the prepreg were pealed from one end in the length direction of the test specimen to a position of 50 mm. Then, by setting the position of 50 mm from one end in the length direction of the specimen at the center, using a tensile tester (manufactured by Orientec Co., Ltd.), 90 degree peeling was conducted at a tensile rate of 50 mm/min., whereby the maximum load was taken as the peel strength (N/10 mm). The larger the peel strength, the better the adhesion between the resin layer and the prepreg.

Production Example 1

Using NAH (himic anhydride, manufactured by Hitachi Chemical Co., Ltd.) as a monomer to form units (1), and PPVE ($CF_2=CFO(CF_2)_3F$, manufactured by Asahi Glass Company, Limited), polymer (X-1) was produced by the procedure as described in of WO2016/017801.

The copolymerization composition of the polymer (X-1) was NAH units/TFE units/PPVE units=0.1/97.9/2.0 (mol %). The melting point of the polymer (X-1) was 300° C., the dielectric constant was 2.1, MFR was 17.6 g/10 min., and the average particle size was 1,554 μm.

Then, using a jet mill (manufactured by Seishin Enterprise Co., Ltd., a single track jet mill FS-4 type), the polymer (X-1) was pulverized under conditions of a pulverization pressure of 0.5 MPa and a treating rate of 1 kg/hr, to obtain a resin powder (A). The average particle size of the resin powder (A) was 2.58 μm, and D90 was 7.1 μm. The loosely packed bulk density of the resin powder (A) was 0.278 g/mL, and the densely packed bulk density was 0.328 g/mL.

Production Example 2

Using a jet mill (manufactured by Seishin Enterprise Co., Ltd., a single track jet mill FS-4 type), PTFE (manufactured by Asahi Glass Company, Limited L169J) was pulverized under conditions of a pulverization pressure of 0.5 MPa and a treating rate of 1 kg/hr, to obtain a resin powder (B) made of PTFE. The average particle size of the resin powder (B) was 3.01 μm, D90 was 8.5 μm, the loosely packed bulk density was 0.355 g/mL, and the densely packed bulk density was 0.387 g/mL.

Example 1

To 120 g of the resin powder (A), a mixed aqueous solution of 9 g of a nonionic surfactant (manufactured by Neos Company Limited, Ftergent 250) and 234 g of distilled water was added slowly, followed by stirring for 60 minutes by using a stirrer Laboratory Stirrer (manufactured by Yamato Scientific Co., Ltd., Model: LT-500) to obtain dispersion (C-1).

Example 2

Dispersion (C-2) was obtained in the same manner as in Example 1 except that the nonionic surfactant was changed to FTX-218P (manufactured by Neos Company Limited), and the distilled water was changed to N-methyl-2-pyrrolidone.

Example 3

Dispersion (C-3) was obtained in the same manner as in Example 1 except that the nonionic surfactant was changed to FTX-218P (manufactured by Neos Company Limited), and the distilled water was changed to N,N-dimethylformamide.

Example 4

Dispersion (C-4) was obtained in the same manner as in Example 1 except that the nonionic surfactant was changed to Ftergent 710FM (manufactured by Neos Company Limited), and the distilled water was changed to N,N-dimethylacetamide.

Comparative Example 1

Dispersion (C-5) was obtained in the same manner as in Example 1 except that instead of the resin powder (A), the resin powder (B) obtained in Production Example 2 was used.

[Evaluation of Dispersibility]

With respect to the dispersion obtained in each Example, the dispersion state after being left to stand for 1 hour and after being left to stand for 3 days was visually observed to evaluate the dispersibility according to the following evaluation standards.

<After being Left to Stand for 1 Hour>

◯: The resin powder does not precipitate, and no separation of the resin powder and the liquid medium is observed.

x: The resin powder precipitates, and separation of the resin powder and the liquid medium is observed.

<After being Left to Stand for 3 Days>

◯: Although separation between the resin powder and the liquid medium is observed, when stirred again for 6 hours by a laboratory stirrer, no floating of aggregates is observed and redispersion is possible.

x: Separation between the resin powder and a liquid medium is observed, and even if stirred again for 6 hours by a laboratory stirrer, floating of aggregates is observed and redispersion is not possible.

The evaluation results of the respective Examples are shown in Table 1. Abbreviations in Table 1 have the following meanings.

F250: Ftergent 250 (manufactured by Neos Company Limited)

FTX-218P: FTX-218P (manufactured by Neos Company Limited)

NMP: N-methyl-2-pyrrolidone

DMF: N,N-dimethylformamide

DMAc: N,N-dimethylacetamide

TABLE 1

| | | Example 1 | Example 2 | Example 3 | Example 4 | Comp. Example 1 |
|---|---|---|---|---|---|---|
| Dispersion | | C-1 | C-2 | C-3 | C-4 | C-5 |
| Resin powder | Type | A | A | A | A | B |
| | Fluorinated copolymer | X-1 | X-1 | X-1 | X-1 | PTFE |
| | Average particle size [μm] | 2.58 | 2.58 | 2.58 | 2.58 | 3.01 |
| | D90 [μm] | 7.1 | 7.1 | 7.1 | 7.1 | 8.5 |
| Surfactant | | F250 | FTX-218P | FTX-218P | FTX-218P | F250 |
| Liquid medium | | Distilled water | NMP | DMF | DMAc | Distilled water |
| Dispersibility | After being left to stand for 1 hour | ◯ | ◯ | ◯ | ◯ | x |
| | After being left to stand for 3 days | ◯ | ◯ | ◯ | ◯ | x |

As shown in Table 1, the dispersion in each of Examples 1 to 4 wherein the resin powder (A) was dispersed in the liquid medium, was excellent in dispersibility, as its dispersion state after being left to stand for 1 hour was good. Further, although separation of the resin powder and a liquid medium was observed after being left to stand for three days, when stirred again for 6 hours by a laboratory stirrer, no floating of aggregates was observed, and it was redispersible and excellent in redispersibility.

On the other hand, the dispersion in Comparative Example 1 wherein the resin powder (B) was used instead of the resin powder (A), was poor in the dispersion state, as a part of the resin powder (B) was precipitated and separated from the liquid medium after being left to stand for 1 hour. Further, after being left to stand for 3 days, the resin powder (B) was all precipitated and separated, and even if stirred again for 6 hours by a laboratory stirrer, floating of aggregates was observed and no uniform dispersion was obtained, and the redispersibility was poor.

Example 5

Dispersion (C-1) obtained in Example 1 was applied on a copper foil and dried to prepare two sheets of single-sided copper-clad laminate. Then, the two sheets of single sided copper-clad laminate were stacked so that the resin layers faced each other, and subjected to vacuum heat pressing at a pressing temperature of 340° C. under a pressing pressure of 4.0 MPa for a pressing time of 15 minutes to obtain a double-sided copper-clad laminate. The obtained double-sided copper-clad laminate was subjected to etching, and measurement results of the dielectric constant and peel strength are shown in Table 2.

Example 6

A double-sided copper-clad laminate was obtained in the same manner as in Example 5 except that to the dispersion (C-2) obtained in Example 2, a silica filler (SFP-30M, manufactured by Denka Company Limited) having an average particle size of 0.7 μm was added so as to be 25 mass %, and the mixed liquid was used instead of the dispersion (C-1). Measurement results of the peel strength are shown in Table 2.

Comparative Example 2

A double-sided copper-clad laminate was obtained in the same manner as in Example 5, except that the dispersion (C-5) obtained in Comparative Example 1 was used instead of the dispersion (C-1). Measurement results of the peel strength are shown in Table 2.

TABLE 2

| | Example 5 | Example 6 | Comparative Example 2 |
|---|---|---|---|
| Dispersion | C-1 | C-2 | C-5 |
| Presence or absence of silica | Absent | Present | Absent |
| Peel strength [N/10 mm] | 11 | 8 | 0.3 |
| Dielectric constant | 2.1 | — | — |

As shown in Table 2, in each of Examples 5 and 6 wherein the dispersion of the present invention was used, as compared with Comparative Example 2 wherein dispersion (C-5) poor in the dispersion state was used, the peel strength between the resin layer and the copper foil in the double-sided copper-clad laminate was high.

Example 7

A dispersion was obtained in the same manner as in Example 1 except that the nonionic surfactant was changed to Ftergent 710-FM (manufactured by Neos Company Limited), and the distilled water was changed to diethylene glycol dibutyl ether. Subsequently, using a horizontal ball mill, the dispersion obtained as described above was dispersed by zirconia balls of 15 mm in diameter, to obtain dispersion (C-6). Dispersion (C-6) was applied on a copper foil, dried at 220° C. for 15 minutes under a nitrogen atmosphere, and then heated at 350° C. for 15 minutes, followed by annealing to prepare two sheets of single-sided copper-clad laminate having a resin layer thickness of 30 µm. Then, the two sheets of single-sided copper-clad laminate were stacked so that the resin layers faced each other, and subjected to vacuum heat pressing at a pressing temperature of 340° C. under a pressing pressure of 4.0 MPa for a pressing time of 15 minutes to obtain a double-sided copper-clad laminate.

Example 8

Dispersion (C-7) was obtained in the same manner as in Example 7, except that the diethylene glycol dibutyl ether was changed to butyl carbitol acetate. Dispersion (C-7) was applied on a copper foil and dried at 250° C. for 15 minutes under a nitrogen atmosphere to obtain a single-sided copper-clad laminate and double-sided copper clad laminate in the same manner as in Example 7. Warpage of the single-sided copper clad laminate was 4.4%, and thus, the warpage was small.

Example 9

Dispersion (C-8) was obtained in the same manner as in Example 7, except that the butyl carbitol acetate was changed to butyl carbitol. Dispersion (C-8) was applied on a copper foil and dried at 230° C. for 15 minutes under a nitrogen atmosphere to obtain a single-sided copper-clad laminate and double-sided copper clad laminate in the same manner as in Example 7. Warpage of the single-sided copper clad laminate was 5.0%, and thus, the warpage was small.

Example 10

To 120 g of a silica filler (SFP-30M, manufactured by Denka Company Limited) having an average particle size of 0.7 µm, a mixed aqueous solution of 9 g of a nonionic surfactant (manufactured by Neos Company Limited, Ftergent 250) and 234 g of distilled water was slowly added and stirred for 60 minutes by a stirrer Laboratory Stirrer (manufactured by Yamato Scientific Co., Ltd., Model: LT-500) to obtain dispersion (C-9). Dispersion (C-1) prepared in Example 1 and dispersion (C-9) were mixed in a mass ratio of (C-1):(C-9)=70:30 and stirred by the laboratory stirrer to obtain a uniform dispersion. Subsequently, using a horizontal ball mill, the dispersion obtained as described above was dispersed by zirconia balls of 15 mm in diameter, to obtain dispersion (C-10). Dispersion (C-10) was applied on a copper foil, dried at 100° C. for 15 minutes under a nitrogen atmosphere, and then heated at 350° C. for 15 minutes, followed by annealing to prepare a single-sided copper-clad laminate. The obtained laminate was shaped into a 7 cm square laminate, which was never curled up into a cylindrical shape, and the warpage was suppressed.

Example 11

A single-sided copper-clad laminate was prepared in the same manner as in Example 10, except that dispersion (C-11) was obtained by adjusting (C-1):(C-9) in Example 10 to a mass ratio of 60:40. The obtained single-sided copper-clad laminate was shaped into a 7 cm square laminate, which was never curled up into a cylindrical shape, and the warpage was suppressed.

Example 12

A single-sided copper-clad laminate was prepared in the same manner as in Example 10, except that dispersion (C-12) was obtained by adjusting (C-1):(C-9) in Example 10 to a mass ratio of 50:50. The obtained single-sided copper-clad laminate was shaped into a 7 cm square laminate, which was never curled up into a cylindrical shape, and the warpage was suppressed.

Example 13

A single-sided copper-clad laminate was prepared in the same manner as in Example 10, except that dispersion (C-13) was obtained by adjusting (C-1):(C-9) in Example 10 to a mass ratio of 40:60. The obtained single-sided copper-clad laminate was shaped into a 7 cm square laminate, which was never curled up into a cylindrical shape, and the warpage was suppressed.

Example 14

Dispersion (C-14) was obtained in the same manner as in Example 7, except that the butyl carbitol acetate was changed to DMF. Dispersion (C-14) was applied on a copper foil, dried at 150° C. for 15 minutes under a nitrogen atmosphere, and then heated at 350° C. for 15 minutes, whereupon a double-sided copper-clad laminate was obtained in the same manner as in Example 7.

Example 15

Dispersion (C-15) was obtained in the same manner as in Example 7, except that the butyl carbitol acetate was changed to DMAC. Dispersion (C-15) was applied on a copper foil, and dried at 165° C. for 15 minutes under a nitrogen atmosphere, to obtain a double-sided copper-clad laminate in the same manner as in Example 7.

The peel strength in each of Examples 7 to 15 and the dielectric constant in each of Examples 10 to 13 are shown in Table 3.

TABLE 3

|  | Example 7 | Example 8 | Example 9 | Example 10 | Example 11 | Example 12 | Example 13 | Example 14 | Example 15 |
|---|---|---|---|---|---|---|---|---|---|
| Dispersion | C-6 | C-7 | C-8 | C-10 | C-11 | C-12 | C-13 | C-14 | C-15 |
| Peel strength [N/10 mm] | 11 | 11 | 11 | 9 | 8 | 7 | 7 | 12 | 11 |
| Resin layer thickness [µmt] | 30 | 5 | 10 | 25 | 25 | 25 | 25 | 20 | 20 |
| Dielectric constant | — | — | — | 2.55 | 2.6 | 2.7 | 2.8 | — | — |

Example 16

Dispersion (C-1) and AD-911E (average particle size: 0.25 µm) manufactured by Asahi Glass Company, Limited being a PTFE dispersion were mixed in a mass ratio of (C-1):AD-911E=60:40 and stirred by a laboratory stirrer to obtain uniform dispersion (D-1). Dispersion (D-1) was applied on a copper foil, dried at 100° C. for 15 minutes under a nitrogen atmosphere, and then heated at 350° C. for 15 minutes, followed by annealing to prepare two sheets of single-sided copper-clad laminate. Then, the two sheets of single-sided copper-clad laminate were stacked so that the resin layers faced each other, and subjected to vacuum heat pressing at a pressing temperature of 340° C. under a pressing pressure of 4.0 MPa for a pressing time of 15 minutes to obtain a double-sided copper-clad laminate.

Example 17

Dispersion (C-1) was applied on a copper foil, dried at 100° C. for 15 minutes under a nitrogen atmosphere, and then heated at 350° C. for 15 minutes, followed by annealing to prepare a single-sided copper-clad laminate. Then, two sheets of the single-sided copper clad laminate were stacked so that the resin layers faced each other with a PTFE sheet having a thickness of 0.1 mm (manufactured by Yodogawa Hu-Tech Co., Ltd., PTFE sheet) at the center, and subjected to vacuum heat pressing at a pressing temperature of 340° C. under a pressing pressure of 4.0 MPa and a pressing time of 15 minutes to obtain a double-sided copper-clad laminate.

Example 18

Dispersion (C-1) was applied on a copper foil, dried at 100° C. for 15 minutes under a nitrogen atmosphere, and then heated at 350° C. for 15 minutes, followed by annealing to prepare a single-sided copper-clad laminate.

The single-sided copper-clad laminate was overlaid so that its resin layer was in contact with a polyimide film (manufactured by Du Pont-Toray Co., Ltd., Kapton 100EN, hereinafter referred to also as "PI"), followed by vacuum heat pressing at a pressing temperature of 340° C. under a pressing pressure of 4.0 MPa for a pressing time of 15 minutes to prepare a single-sided copper-clad laminate having a copper foil/resin layer/PI structure. The obtained single-sided copper-clad laminate was shaped into a 7 cm square laminate, which was never curled up into a cylindrical shape, and the warpage was suppressed.

Example 19

Dispersion (C-1) was applied on PI, dried at 100° C. for 15 minutes under a nitrogen atmosphere, and then heated at 350° C. for 15 minutes, followed by annealing to prepare two sheets of laminate having a PI/resin layer structure. The obtained laminates were stacked so that the resin layers faced each other, and subjected to vacuum heat pressing at a pressing temperature of 340° C. under a pressing pressure of 4.0 MPa for a pressing time of 15 minutes to prepare a laminate having a P I/resin layer/PI structure. The obtained laminate was shaped into a 7 cm square laminate, which was never curled up into a cylindrical shape, and the warpage was suppressed.

Example 20

Dispersion (C-1) was applied on a copper foil, dried at 100° C. for 15 minutes under a nitrogen atmosphere, and then heated at 350° C. for 15 minutes, followed by annealing to prepare a single-sided copper-clad laminate.

Two sheets of the single-sided copper clad laminate were overlaid so that the resin layers were in contact with PI, followed by vacuum heat pressing at a pressing temperature of 340° C. under a pressing pressure of 4.0 MPa for a pressing time of 15 minutes, to prepare a double-sided copper-clad laminate having a copper foil/resin layer/PI/resin layer/copper foil structure.

Example 21

Dispersion (C-1) was impregnated to a glass cloth (manufactured by Arisawa Manufacturing Co., Ltd., Product Number: #1031) and dried at 110° C. for 20 minutes to obtain a prepreg. Copper foils were overlaid on both surfaces of the prepreg, followed by vacuum heat pressing at a pressing temperature of 340° C. under a pressing pressure of 4.0 MPa for a pressing time of 15 minutes, to prepare a double-sided copper-clad laminate having a copper foil/prepreg/copper foil structure. Using the obtained laminate, CTE (z) being the linear expansion coefficient was measured and found to be 189 ppm/° C.

Example 22

Dispersion (C-1) was applied on a copper foil, dried at 100° C. for 15 minutes under a nitrogen atmosphere, and then heated at 350° C. for 15 minutes, followed by annealing to prepare two sheets of a single-sided copper-clad laminate. The single-sided laminates were stacked so that their resin layers were in contact with an epoxy-type prepreg (manufactured by Hitachi Chemical Co., Ltd., GEA-67N), followed by vacuum heat pressing at a pressing temperature of 180° C. under a pressing pressure of 3.0 MPa for a pressing time of 60 minutes, to prepare a double-sided copper-clad laminate having a copper foil/resin layer/cured epoxy resin layer/resin layer/copper foil structure.

The resin layer thickness and peel strength in each of Examples 16 to 22 are shown in Table 4.

TABLE 4

|  | Example 16 | Example 17 | Example 18 | Example 19 | Example 20 | Example 21 | Example 22 |
| --- | --- | --- | --- | --- | --- | --- | --- |
| Dispersion | D-1 | C-1 | C-1 | C-1 | C-1 | C-1 | C-1 |
| Peel strength [N/10 mm] | 12 | 9 | 9 | 8 | 10 | 10 |  |
| Resin layer thickness [µmt] | 30 | 30 | 25 | 25 | 25 | 25 | 25 |

Example 23

The single-sided copper-clad laminate obtained in Example 5 was subjected to etching to remove the copper foil to obtain a film. In the obtained film, the thermal expansion rates in the MD direction (the coating direction at the time of coating the dispersion) and in the TD direction (the direction vertical to the MD direction) were measured by a TMA apparatus. Using, as the measurement apparatus, TMA402F1Hyperion manufactured by NETZSCH, and as the measurement mode, a tension mode, the measurement was made at a measuring temperature of from 30° C. to 100° C. under a measuring load of 19.6 mN at a temperature raising rate of 5° C./min. under a measurement atmosphere of a nitrogen atmosphere, and the thermal expansion rate at the time of raising the temperature from 30° C. to 100° C. was measured. The obtained film was shaped into a 7 cm square film, which was not curled up into a cylindrical shape, and the warpage was suppressed.

Example 24

The single-sided copper-clad laminate obtained in Example 14 was subjected to etching to remove the copper foil to obtain a film which was coated with copper. Of the obtained film, the thermal expansion rates in the MD and TD directions were measured by using a TMA device. The obtained film was shaped into a 7 cm square film, which was not curled up into a cylindrical shape, and the warpage was suppressed.

Example 25

The single-sided copper-clad laminate obtained in Example 7 was subjected to etching to remove the copper foil to obtain a film which was coated with copper. Of the obtained film, the thermal expansion rates in the MD and TD directions were measured by using a TMA device. The obtained film was shaped into a 7 cm square film, which was not curled up into a cylindrical shape, and the warpage was suppressed.

Comparative Example 3

Using a commercially available PFA fluororesin, a fluororesin film was prepared by a conventional known method. Of the obtained fluororesin film, the thermal expansion rates in the MD and TD directions were measured by using a TMA device. The obtained film was shaped into a 7 cm square film, which was not curled one turn into a cylindrical shape, but the warpage was observed.

The thermal expansion rates in the MD and TD directions in each of Examples 23 to 25 and Comparative Example 3 were obtained. The thermal expansion rate is shown by "+", and the contraction rate is shown by "−". The respective thermal expansion (contraction) rates in the MD direction/TD direction, the thermal expansion (contraction) change ratio, the resin layer thickness and the peel strength are shown in Table 5.

Here, the thermal expansion (contraction) change ratio is the ratio of x-direction (large thermal expansion (contraction) rate) to y-direction (small thermal expansion (contraction) rate), and is represented by "x/y".

TABLE 5

|  | Example 23 | Example 24 | Example 25 | Comp. Example 3 |
|---|---|---|---|---|
| Dispersion | C-1 | C-14 | C-6 |  |
| Thermal expansion rate (+) contraction rate (−) | +0.81/+0.83 | +0.85/+0.83 | +0.82/+0.90 | −1.5/−1 |

TABLE 5-continued

|  | Example 23 | Example 24 | Example 25 | Comp. Example 3 |
|---|---|---|---|---|
| x/y | 1.02 | 1.02 | 1.10 | 1.50 |
| Resin layer thickness [µmt] | 25 | 25 | 25 | 25 |

Example 26

The double-sided copper-clad laminate obtained in Example 21 was subjected to vacuum heat pressing at a pressing temperature of 170° C. under a pressing pressure of 0.005 MPa for 30 minutes, followed by annealing. Using the obtained double-sided copper clad laminate, CTE (z) as the linear expansion coefficient was measured and found to be 45 ppm/° C.

Example 27

To 120 g of the resin powder (A), 12 g of a nonionic surfactant (manufactured by Neos Company Limited, Ftergent 710FL) and 234 g of methyl ethyl ketone were charged into a horizontal ball mill pot and dispersed by zirconia balls of 15 mm in diameter to obtain dispersion (C-16). Dispersion (C-16) was applied on a copper foil having a thickness of 12 µm, dried at 100° C. for 15 minutes in a nitrogen atmosphere, and heated at 350° C. for 15 minutes, followed by annealing to obtain a single-sided copper-clad laminate having a resin layer having a thickness of 7 µm.

The surface of the resin layer of the obtained one-sided copper-clad laminate was plasma-treated. As the plasma treatment apparatus, AP-1000 of NORDSON MARCH was used. As the plasma treatment conditions, the RF output of AP-1000 was set to be 300 W, the gap between the electrodes was set to be 2 inches, the type of the introduced gas was argon (Ar), the introduced gas flow rate was set to be 50 cm$^3$/min., the pressure was set to be 13 Pa, and the treating time was set to be 1 minute. The arithmetic average roughness Ra of the surface of the resin layer after plasma treatment was 2.5 µm.

On the resin layer side of the single-sided copper clad laminate within 72 hours after conducting the surface treatment, FR-4 (manufactured by Hitachi Chemical Co., Ltd., reinforcing fibers: glass fibers, matrix resin: an epoxy resin, product name: CEA-67N 0.2t (HAN), thickness: 0.2 mm) as a prepreg, was overlaid, and subjected to vacuum heat pressing under conditions of a pressing temperature of 185° C. under a pressing pressure of 3.0 MPa for a pressing time of 60 minutes to obtain a metal laminate (No. 1).

A single-sided copper-clad laminate was prepared in the same manner as above, except that the plasma treatment conditions were changed as shown in Table 6, and a metal laminate was obtained in the same manner as described above except that the single-sided copper-clad laminate was used (No. 2 to 7).

The plasma treatment conditions in each Ex., as well as the measured results of the arithmetic average roughness Ra of the surface of the resin layer after the plasma treatment, the surface functional group density and the peel strength between the resin layer and the layer made of the prepreg, are shown in Table 6.

TABLE 6

| Example 27 No. | Plasma treatment conditions | | | | | | Surface of resin layer | |
|---|---|---|---|---|---|---|---|---|
| | Gap between electrodes [inches] | Introduced gas | | Pressure [Pa] | RF output [W] | Treating time [min.] | Arithmetic average roughness Ra [μm] | Peel strength [N/10 mm] |
| | | Type | Flow rate [cm³/min.] | | | | | |
| 1 | 2 | Ar | 50 | 13 | 300 | 1 | 2.5 | 11.3 |
| 2 | 2 | Ar | 50 | 13 | 300 | 2 | 2.7 | 12.5 |
| 3 | 1 | Ar | 10 | 5 | 300 | 1 | 2.5 | 10.5 |
| 4 | 1 | Ar | 10 | 5 | 300 | 2 | 2.3 | 10.1 |
| 5 | — | — | — | — | — | — | 1.6 | 2.0 |
| 6 | 1 | Ar | 10 | 5 | 300 | 3 | 1.7 | 3.2 |
| 7 | 1 | Ar | 10 | 5 | 300 | 4 | 1.7 | 4.1 |

As shown in Table 6, in each of No. 1 to 4 wherein Ra of the surface of the resin layer was made to be at least 2.0 μm, the peel strength between the resin layer and the layer made of the prepreg was high, and their adhesion was excellent.

Example 28

Dispersion (C-6) was applied on a copper foil and dried at 100° C. for 15 minutes under a nitrogen atmosphere. The copper foil side of the obtained laminate was bonded to a polyimide tape adhered to a polyimide roll being a transport roll of "Noritake Co., Limited R-to-R type NORITAKE far infrared N2 atmosphere furnace" and heated at a set temperature of 340° C. at an oxygen concentration of 200 ppm to prepare a single-sided copper-clad laminate. The roll speed was controlled so that the heating time would be 1 minute (utilizing a heating furnace of 4.7 m, roll speed: 4.7 m/min.).

After the heat treatment, the molten state of the polymer (X) was evaluated by visual inspection (No. 1).

Evaluation was made by visual judgement from the number of foreign substances remaining after melting (optical heterogeneous substances) and the molten state. The standards for the judgement are shown below.

The number of foreign substances:

1: The number of foreign substances that can be visually observed in an area of 10 cm² is more than 50.

2: The number of foreign substances that can be visually observed in an area of 10 cm² is more than 20 and at most 50.

3: The number of foreign substances that can be visually observed in an area of 10 cm² is at most 20.

Molten State:

1: White unmelted is partly observed.

2: No white unmelted is observed, but gloss is not observed partially.

3: No unmelted is observed (the entire surface appears to be glossy).

A single-sided copper-clad laminate was produced in the same manner as described above except that the set temperature (heating temperature), the heating time (heating furnace residence time), the length of the heating furnace and the roll speed in each Ex. were changed as shown in Table 7 (No. 2 to 8).

TABLE 7

| Example 28 No. | Length of heating furnace [m] | Roll speed [m/min.] | Heating time [min.] | Heating temperature [° C.] | Oxygen concentration [ppm] | Presence or absence of foreign substances | Molten state |
|---|---|---|---|---|---|---|---|
| 1 | 4.7 | 4.7 | 1 | 340 | 200 | 1 | 2 |
| 2 | 4.7 | 4.7 | 1 | 350 | 200 | 2 | 3 |
| 3 | 4.7 | 4.7 | 1 | 360 | 200 | 3 | 3 |
| 4 | 4.7 | 4.7 | 1 | 370 | 200 | 3 | 3 |
| 5 | 4.7 | 1.57 | 3 | 350 | 200 | 3 | 2 |
| 6 | 4.7 | 1.57 | 3 | 360 | 200 | 3 | 3 |
| 7 | 2.35 | 4.7 | 0.5 | 350 | 200 | 1 | 3 |
| 8 | 2.35 | 4.7 | 0.5 | 360 | 200 | 2 | 3 |

In addition, with respect to each of No. 3, 4 and 6, the size of a foreign substance was measured by using a microscope. For the size of the foreign substance, the short and long portions were measured from the photographic image by the microscope, and their average measured length was taken as the size of the foreign substance. Foreign substances were observed and measured by using SCOPEMAN DIGITAL CCD MICROSCOPE MS-804 manufactured by MORITEX CORPORATION. One with a size exceeding 30 μm was counted as a foreign substance, and the number of foreign substances present in an area of 10 cm² was counted. In each of No. 3, 4 and 6, the number of foreign substances that can be confirmed by the microscope in an area of 10 cm² was at most 20.

INDUSTRIAL APPLICABILITY

The film, fiber-reinforced film, prepreg, metal laminate, printed circuit board, etc. obtainable by the present invention, are useful for antenna parts, printed circuit boards, aircraft parts, parts for automobiles, sports equipment, food industry equipment, saws, a coated article such as a sliding bearing, etc.

This application is a continuation of PCT Application No. PCT/JP2017/026552, filed on Jul. 21, 2017, which is based upon and claims the benefit of priority from Japanese Patent Application No. 2016-144722 filed on Jul. 22, 2016, Japanese Patent Application No. 2017-026385 filed on Feb. 15, 2017 and Japanese Patent Application No. 2017-099294 filed on May 18, 2017. The contents of those applications are incorporated herein by reference in their entireties.

What is claimed is:

1. A liquid composition, comprising:
a liquid medium; and
a resin powder dispersed in the liquid medium, wherein
a volume-based cumulative 90% diameter of the resin powder is at most 8 μm, and the liquid composition satisfies the following (1):
(1) the liquid medium comprises water, and
the resin powder consists essentially of polymer (X), which is a fluorinated polymer having units based on tetrafluoroethylene, units based on a perfluoroalkyl vinyl ether, and units having an acid anhydride residue and having a melting point of from 260 to 380° C., and to the total of the units based on tetrafluoroethylene, units based on a perfluoroalkyl vinyl ether and units having an acid anhydride residue, a proportion of units having an acid anhydride residue is from 0.01 to 3 mol %, a proportion of tetrafluoroethylene is from 90 to 99.89 mol %, and a proportion of units based on a perfluoroalkyl vinyl ether is from 0.1 to 9.99 mol %.

2. The liquid composition according to claim 1, wherein the liquid composition further comprises a surfactant.

3. The liquid composition according to claim 1, wherein the liquid composition further comprises a powder of a resin made of a polymer other than the polymer (X) or an inorganic filler.

4. The liquid composition according to claim 1, wherein an average particle size of the resin powder is from 0.3 to 6 μm.

5. The liquid composition according to claim 1, wherein a content of the liquid medium in the liquid composition is from 10 to 500 parts by mass to 100 parts by mass of the resin powder.

6. The liquid composition according to claim 1, wherein a content of the liquid medium in the liquid composition is from 30 to 250 parts by mass to 100 parts by mass of the resin powder.

7. The liquid composition according to claim 1, wherein the liquid composition further comprises a surfactant, and
a content of the surfactant in the liquid composition is from 0.1 to 20 parts by mass to 100 parts by mass of the resin powder.

8. The liquid composition according to claim 2, wherein the surfactant is a fluorine-based additive having at least a fluorinated group selected from the group consisting of a perfluoroalkyl group and a perfluoroalkenyl group, and a hydrophilic group selected from the group consisting of ethylene oxide, propylene oxide, an amino group, a ketone group, a carboxy group and a sulfonic group.

9. The liquid composition according to claim 7, wherein the surfactant is a fluorine-based additive having at least a fluorinated group selected from the group consisting of a perfluoroalkyl group and a perfluoroalkenyl group, and a hydrophilic group selected from the group consisting of ethylene oxide, propylene oxide, an amino group, a ketone group, a carboxy group and a sulfonic group.

10. The liquid composition according to claim 1, wherein the liquid composition further comprises an inorganic filler, and
a content of the inorganic filler in the liquid composition is from 10 to 60 parts by mass to 100 parts by mass of the resin powder.

11. The liquid composition according to claim 1, wherein an average particle size of the resin powder is from 0.5 to 4.5 μm.

12. The liquid composition according to claim 1, wherein a volume-base cumulative 90% diameter of the resin powder is at most 6 μm.

13. The liquid composition according to claim 1, wherein the liquid composition is used to produce a metal laminate, a printed circuit board, or prepreg.

14. A liquid composition, comprising:
a liquid medium; and
a resin powder dispersed in the liquid medium, wherein
a volume-based cumulative 90% diameter of the resin powder is at most 8 μm, and
the liquid composition satisfies the following (2):
(2) the liquid medium comprises a nitrogen-containing compound, a sulfur-containing compound, an ether, an ester, or a ketone, and the resin powder consists essentially of polymer (X), which is a fluorinated polymer having units based on tetrafluoroethylene and having at least one functional group selected from the group consisting of a carbonyl group-containing group, a hydroxy group, an epoxy group and an isocyanate group,
wherein the polymer (X) is a fluorinated polymer having units based on tetrafluoroethylene, units based on a perfluoroalkyl vinyl ether, and units having an acid anhydride residue, and to the total of the units based on tetrafluoroethylene, units based on a perfluoroalkyl vinyl ether and units having an acid anhydride residue, a proportion of units having an acid anhydride residue is from 0.01 to 3 mnol %, a proportion of tetrafluoroethylene is from 90 to 99.89 mol %, and a proportion of units based on a perfluoroalkyl vinyl ether is from 0.1 to 9.99 mol %.

15. The liquid composition according to claim 14, wherein the functional group is a carbonyl group-containing group.

16. The liquid composition according to claim 1, wherein the units having in acid anhydride residue are units based on itaconic anhydride, citraconic anhydride, 5-norbornene-2,3-dicarboxylic anhydride or maleic anhydride.

17. The liquid composition according to claim 14, wherein the units having an acid anhydride residue are units based on itaconic anhydride, citraconic anhydride, 5-norbornene-2,3-dicarboxylic anhydride or maleic anhydride.

18. The liquid composition according to claim 14, wherein the liquid medium comprises at least one selected from the group consisting of γ-butyrolactone, acetone, methyl ethyl ketone, hexane, heptane, octane, 2-heptanone, cycloheptanone, cyclohexanone, cyclohexane, methylcyclohexane, ethylcyclohexane, methyl-n-pentyl ketone, methyl isobutyl ketone, methyl isopentyl ketone, cyclohexyl acetate, ethyl 3-ethoxypropionate, dioxane, methyl lactate, ethyl lactate, methyl acetate, ethyl acetate, butyl acetate, methyl pyruvate, ethyl pyruvate, methyl methoxypropionate, ethyl ethoxypropionate, anisole, ethylbenzyl ether, cresyl methyl ether, diphenyl ether, dibenzyl ether, phenetole, butyl phenyl ether, benzene, ethylbenzene, diethylbenzene, pentylbenzene, isopropylbenzene, toluene, xylene, cymene, mesitylene, methyl monoglycidyl ether, ethyl monoglycidyl ether, dimethylfomamide, mineral spirits, N,N-diethylformamide, N,N-dimetylacetamide, and N-methyl-2-pyrrolidone.

19. The liquid composition according to claim 14, wherein
   an average particle size of the resin powder is from 0.3 to 6 μm.

20. The liquid composition according to claim 14, wherein
   a content of the liquid medium in the liquid composition is from 10 to 500 parts by mass to 100 parts by mass of the resin powder.

21. The liquid composition according to claim 14, Wherein an average particle size of the resin powder is from 0.5 to 4.5 μm.

22. The liquid composition according to claim 14, wherein a volume-base cumulative 90% diameter of the resin powder is at most 6 μm.

* * * * *